(12) United States Patent
Forbes

(10) Patent No.: US 7,233,531 B2
(45) Date of Patent: *Jun. 19, 2007

(54) SRAM CELL WITH HORIZONTAL MERGED DEVICES

(75) Inventor: Leonard Forbes, Corvallis, OR (US)

(73) Assignee: Micro Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/282,273

(22) Filed: Nov. 18, 2005

(65) Prior Publication Data

US 2006/0067110 A1 Mar. 30, 2006

Related U.S. Application Data

(60) Continuation of application No. 10/715,105, filed on Nov. 17, 2003, now Pat. No. 7,020,030, which is a division of application No. 09/808,897, filed on Mar. 15, 2001, now Pat. No. 6,654,275.

(51) Int. Cl.
G11C 7/00 (2006.01)
G11C 11/412 (2006.01)

(52) U.S. Cl. .................. 365/189.11; 365/189.09; 365/189.01; 365/154

(58) Field of Classification Search ........... 365/186, 365/187, 188, 154, 189.01, 189.09, 189.11, 365/199, 145
See application file for complete search history.

(56) References Cited

U.S. PATENT DOCUMENTS 5,304,502 A    4/1994   Hanagasaki
5,487,029 A *  1/1996   Kuroda ................. 365/145
5,771,196 A    6/1998   Yang
5,835,400 A * 11/1998   Jeon et al. ............ 365/145
5,950,219 A    9/1999   Rao
6,091,624 A *  7/2000   Kang .................... 365/145
6,104,045 A    8/2000   Forbes et al.
6,128,216 A   10/2000   Noble, Jr. et al.
6,259,644 B1*  7/2001   Tran et al. ............. 365/209
6,275,433 B1   8/2001   Forbes
6,654,275 B2* 11/2003   Forbes .................. 365/154
7,020,030 B2*  3/2006   Forbes ............... 365/189.11

\* cited by examiner

*Primary Examiner*—J. H. Hur
(74) *Attorney, Agent, or Firm*—Schwegman, Lundberg, Woessner & Kluth, P.A.

(57) ABSTRACT

A merged structure SRAM cell is provided that includes a first transistor and a second transistor. The second transistor gate forms a load resistor for the first transistor and the first transistor gate forms a load resistor for the second transistor. Also provided is a method of reading a memory cell that comprises applying a potential difference ($V_{DIFF}$) to a selected memory cell by providing a column line potential ($V_C$) and a row line potential ($V_R$). According to this method, $V_{DIFF}$ is increased by an increment less than a transistor threshold voltage ($V_T$). It is then determined whether the increased $V_{DIFF}$ results in a current flow on the column line for the selected memory cell. Also provided is a method of writing a memory cell that comprises applying $V_{DIFF}$ and increasing $V_{DIFF}$ by an increment more than $V_T$ to set the selected memory cell to a one state.

22 Claims, 20 Drawing Sheets

| OPERATION | CONDITION | EXAMPLE |
|---|---|---|
| RESET (LOGIC ZERO STATE) | $V_{DIFF} - \Delta V_1$; WHEREIN $\Delta V_1 > V_T$ | $V_C$ ─────── $V_C$<br>$\quad\quad\quad\quad\vert\leftarrow\Delta V_1\rightarrow\vert$<br>$\vert\leftarrow V_{DIFF}\rightarrow\vert$<br>$V_R$ ─── $V_R$ |
| SET/WRITE (LOGIC ONE STATE) | $V_{DIFF} + \Delta V_1$; WHEREIN $\Delta V_1 > V_T$ | $V_C$ ─── $V_C$<br>$\vert\leftarrow V_{DIFF}\rightarrow\vert$<br>$\quad\quad\quad\quad\vert\leftarrow\Delta V_1\rightarrow\vert$<br>$V_R$ ─────── $V_R$ |
| WRITE OVERRIDE (LOGIC ZERO STATE) | $V_{DIFF} - \Delta V_1 + \Delta V_2$; WHEREIN $\Delta V_1 > V_T$ | $V_C$ ──────────── $V_C$<br>$\vert\leftarrow\Delta V_2\rightarrow\vert\quad\vert\leftarrow\Delta V_1\rightarrow\vert$<br>$\vert\leftarrow V_{DIFF}\rightarrow\vert$<br>$V_R$ ── $V_R$ |
| READ | $V_{DIFF} + \Delta V_1$; WHEREIN $\Delta V_1 < V_T$ | $V_C$ ─── $V_C$<br>$\vert\leftarrow V_{DIFF}\rightarrow\vert$<br>$\quad\quad\quad\vert\!\Delta V_1\!\vert$<br>$V_R$ ──── $V_R$ |

*Fig. 23*

SRAM CELL WITH HORIZONTAL MERGED DEVICES

RELATED APPLICATION(s)

This application is a continuation of U.S. application Ser. No. 10/715,105, filed Nov. 17, 2003, now issued as U.S. Pat. No. 7,020,030; which is a divisional of U.S. application Ser. No. 09/808,897, filed Mar. 15, 2001, now issued as U.S. Pat. No. 6,654,275; each of which is incorporated herein by reference.

TECHNICAL FIELD OF THE INVENTION

This invention relates generally to semiconductor memory devices and, more particularly, to a static random access memory (SRAM) cell with merged devices, and to read and write techniques for a two transistor SRAM cell.

BACKGROUND OF THE INVENTION

Two goals associated with SRAM cell design include reducing the silicon area consumed by the cells, i.e. increasing the density of the cells in a SRAM device, and include increasing the operating speed of the cells, i.e. decreasing the time required to access a cell to perform a read or write operation. A high density SRAM cell is realized by using fewer transistors. A number of SRAM cell designs have been proposed.

Conventional CMOS SRAM cells essentially consist of a pair of cross-coupled inverters as the storage flip-flop or latch, and a pair of pass transistors as the access devices for data transfer into and out of the cell. SRAM cell designs have progressed from a four transistor SRAM cell illustrated in FIG. 1 and a six transistor SRAM cell illustrated in FIG. 2 to a loadless four transistor SRAM cell illustrated in FIG. 3. The four transistor SRAM cell or NMOS resistor load cell, hereinafter referred to as the 4-T SRAM cell, occupies a relatively small area, but the fabrication of the passive loads involves relatively complex steps. One embodiment of the 4T-SRAM cell has one load resistor for each of the pull-down NMOS transistors, and another embodiment shares one load resistor for the two transistors. The 4-T SRAM cell incurs steady state standby DC power dissipation and can inadvertently become unstable. Additionally, the resistive load inverters used in the 4-T SRAM cell cause asymmetrical switching transients. The six transistor SRAM cell, hereinafter referred to as the 6-T SRAM cell, incurs less power dissipation, is more stable, and has more symmetrical switching transients; but it is approximately 30% to 40% larger than the 4-T SRAM cell, and thus consumes more chip surface area and is more costly to fabricate.

The problems associated with the 4-T SRAM cell and the 6-T SRAM cell have led to the development of the loadless four transistor SRAM cell, hereinafter referred to as the LL4TCMOS SRAM cell. The LL4TCMOS SRAM cell comprises a pair of NMOS pull-down transistors and a pair of PMOS access transistors. The subthreshold leakage of the access transistors replace the load resistor(s) in the 4-SRAM cell and the load transistors in the 6-T SRAM cell. The LM4TCMOS SRAM is relatively small, but is not as small as the 4-T SRAM cell because it incorporates CMOS devices. The LL4TCMOS SRAM cell design suffers from stability margin problems caused by leakage current and noise.

Other SRAM cell design proposals include two transistor SRAM cell designs based on bipolar latch-up. One cell design incorporates vertical transistors, while another design that requires a somewhat larger area incorporates planar devices. Cell designs based on bipolar latch-up are disclosed in U.S. Pat. No. 6,104,045, entitled HIGH DENSITY PLANAR SRAM CELL USING BIPOLAR LATCH-UP AND GATED DIODE BREAKDOWN, and U.S. Pat. No. 6,128,216, entitled HIGH DENSITY PLANAR SRAM CELL WITH MERGED TRANSISTORS. Both of these patents are assigned to Applicant's assignee, and are hereby incorporated by reference.

Therefore, there is a need in the art to provide a SRAM cell, and read and write techniques for the same, that overcomes the shortcomings of the above SRAM designs and that achieves the goals of increased density and increased operating speed.

SUMMARY OF THE INVENTION

The above mentioned problems are addressed by the present subject matter and will be understood by reading and studying the following specification. The present subject matter allows for high density SRAM cell designs by providing a merged structure SRAM cell, i.e. a SRAM cell using merged device structures, and by providing read and write techniques for a two transistor SRAM cell.

One aspect of the present invention provides a merged structure SRAM cell that includes a first transistor and a second transistor. The gate of the second transistor forms a load resistor for the first transistor such that the first transistor and the second transistor gate are coupled in series. The gate of the first transistor forms a load resistor for the second transistor such that the second transistor and the first transistor gate are coupled in series. In one embodiment, the first transistor gate and the second transistor gate are formed from a lightly doped polysilicon material. In one embodiment, the first transistor is coupled to a power supply line with a constant potential and the second transistor gate is coupled to a constant potential reference line such as a ground reference line. The second transistor is coupled to a word reference line with an adjustable potential and the first transistor gate is coupled to a bit line power supply line with an adjustable potential. The first transistor and the second transistor form a bistable circuit such that a first stable state occurs when both the first transistor and the second transistor are on and a second stable state occurs when both the first transistor and the second transistor are off.

Another aspect of the present invention provides a method of reading a memory cell. In one embodiment, this method is used to read a two transistor memory cell either with or without merged devices. According to this method, a potential difference ($V_{DIFF}$) is applied to a selected memory cell by providing a column potential ($V_C$) on a column line and a row potential ($V_R$) on a row line. $V_{DIFF}$, the potential difference between $V_C$ and $V_R$, is increased by an increment less than a transistor threshold voltage ($V_T$). It is then determined whether the increased $V_{DIFF}$ results in a current flow on the column line for the selected memory cell. An increased current flow indicates that the transistor is on and that the memory cell is in a logic one state.

Another aspect of the present invention provides a method of writing a memory cell. In one embodiment, this method is used to write to a two transistor memory cell either with or without merged devices. According to this method, a potential difference ($V_{DIFF}$) is applied to a selected memory cell by providing a column potential ($V_C$) on a column line and a row potential ($V_R$) on a row line. $V_{DIFF}$, the potential difference between $V_C$ and $V_R$, is increased by an increment more than a transistor threshold voltage ($V_T$) to set or write the selected memory cell to a one state.

These and other aspects, embodiments, advantages, and features will become apparent from the following description of the invention and the referenced drawings.

BRIEF DESCRIPTION OF THE DRAWINGS

FIG. 23 shows a method of operating a memory array, including Reset, Write, Write Override, and Read operations, a condition for each operation, and an example of the column line and row line potentials for each operation.

DETAILED DESCRIPTION OF THE INVENTION

Figure 1:
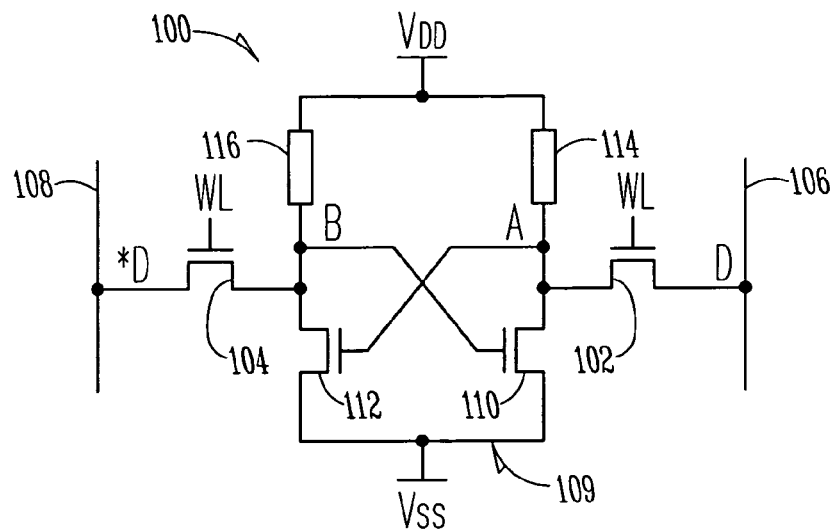
FIG. 1 is a circuit diagram of a conventional 4-T SRAM cell.

The following detailed description of the invention refers to the accompanying drawings which show, by way of illustration, specific aspects and embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. As will be readily apparent to those skilled in the art upon a complete reading of the present application, the present invention is applicable to a variety of technologies, and may be realized using a variety of transistors and devices in other forms and/or arrangements. Further, the present invention will find application in a wide variety of integrated circuit devices, including, but not limited to, microprocessors, logic devices and memory devices. The following detailed description is, therefore, not to be taken in a limiting sense, and the scope of the present invention is defined only by the appended claims, along with the full scope of equivalents to which such claims are entitled.

The present subject matter provides a merged structure SRAM cell. The present subject matter further provides read and write techniques for a two transistor SRAM cell, either with or without merged devices. The merged structure SRAM cell includes a cross-coupled PMOS transistor and NMOS transistor. The polysilicon gate of the NMOS transistor is coupled between a drain/source region of the PMOS transistor and a reference ground potential and functions as a pull-down load resistor for the PMOS transistor. The polysilicon gate of the PMOS transistor is coupled between a drain/source region of the NMOS transistor and a power supply PWRN and functions as a pull-up load resistor for the NMOS transistor. The read and write techniques provided herein eliminate the need for conventional access transistors and thus allow for a two transistor SRAM cell. One embodiment includes an output memory sense scheme that compensates for a slower response caused by a state transition during which current flows through the load resistors rather than the transistors. Thus, the present invention provides a SRAM cell design that reduces the silicon area consumed by the SRAM cells and increases the operating speed of the SRAM cells.

Figure 2:
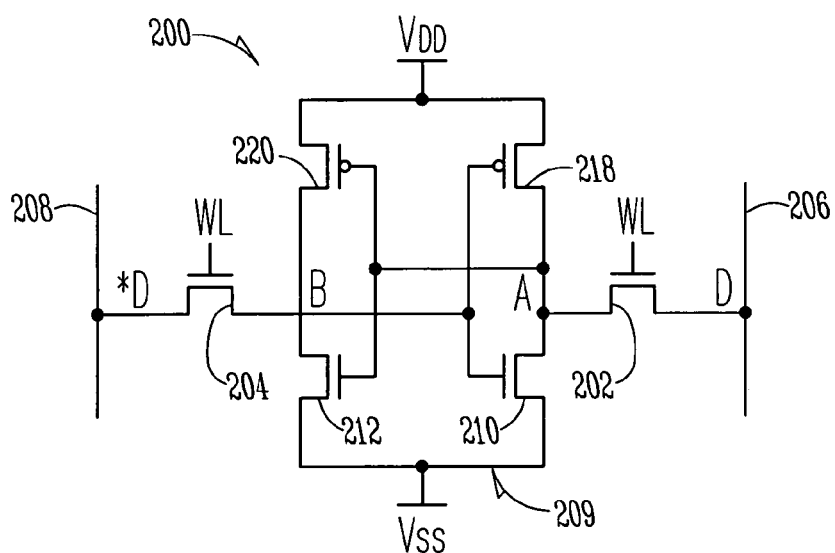
FIG. 2 is a circuit diagram of a conventional 6-T SRAM cell.
Figure 3:
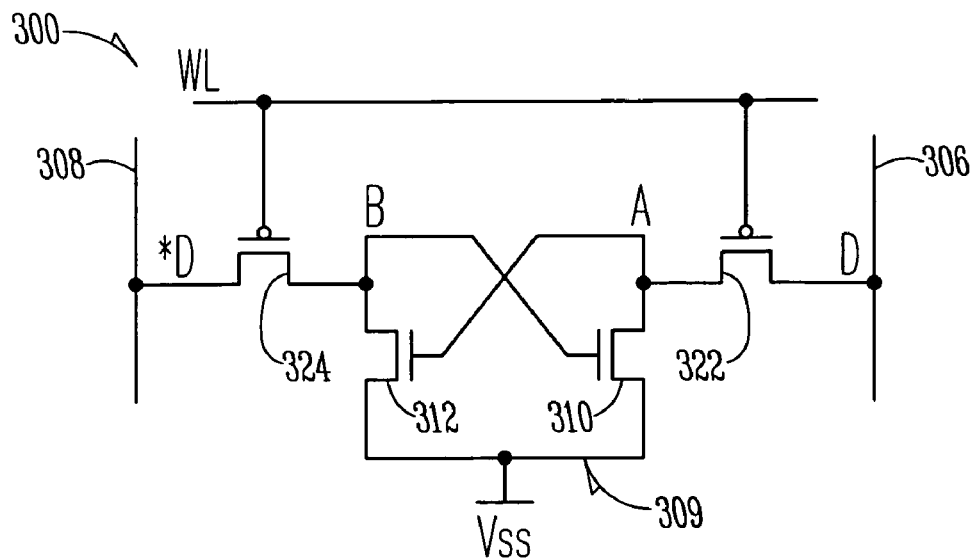
FIG. 3 is a circuit diagram of a conventional LL4TCMOS SRAM cell.

FIGS. 1, 2 and 3 illustrate conventional SRAM cell designs, including a 4-T SRAM cell, a 6-T SRAM cell, and an LL4TCMOS SRAM cell. Each of these cell designs have problems or potential problems, and are described below to provide a background against which the novel aspects of the present invention will be described.

FIG. 1 is a circuit diagram of a conventional 4-T SRAM cell 100. A pair of NMOS access transistors 102 and 104 allow complementary bit values D and *D on the digit lines 106 and 108 to be read from and to be written to a storage circuit 109 of the cell 100. The storage circuit 109 includes NMOS pull-down transistors 110 and 112. Nodes A and B are the complementary inputs/outputs of the storage circuit 109, and the respective complementary logic values at these nodes represent the state of the cell. For example, when the node A is at logic 1 and the node B is at logic 0, then the cell is storing a logic 1. Conversely, when the node A is at logic 0 and the node B is at logic 1, then the cell is storing a logic 0. The cell 100 is bistable as it can have one of two stable states, i.e. logic 1 or logic 0.

During a read of the cell, a word line WL, which is coupled to the gates of the access transistors 102 and 104, is driven to a voltage approximately equal to $V_{DD}$ to activate the transistors. For example, assume that $V_{DD}$=logic 1=5V and $V_{SS}$=logic 0=0V, and that at the beginning of the read, the cell 100 is storing a logic 0 such that the voltage level at the node A is 0V and the voltage level at the node B is 5V. As this is an example, it is noted that $V_{DD}$ or logic 1 may be scaled lower than or otherwise be at another potential other than 5V, and also that logic 0 can be another potential other than 0V. The NMOS access transistor 102 couples the node A to the digit line 106, and the NMOS access transistor 104 couples the node B to the digit line 108. For example, assume that the threshold voltages $V_T$ of the access transistors 102 and 104 are both 1V, then the transistor 104 couples a maximum of 4V from the digit line 108 to the node B. The transistor 102 couples the digit line 106 to the logic 0 potential on node A, which pulls down the voltage on the digit line 106 enough (for example, 100–500 millivolts) to cause a sense amp coupled to the lines to read the cell as storing a logic 0.

During a write of a logic 1 to the cell 100, the access transistors 110 and 112 are activated as discussed above, and a logic 1 is driven onto the digit line 106 and a logic 0 is driven onto the digit line 108. The transistor 102 couples 4V (the 5V on the digit line 106 minus the 1V threshold of the transistor 102) to the node A, and the transistor 104 couples 0V from the digit line 108 to the node B. The low voltage on the node B turns off the NMOS transistor 110. The inactive NMOS transistor 110 allows a passive load 114 to pull the node A up to 5V. This high voltage on the node A turns on the NMOS transistor 112, and allows the NMOS transistor 112 to reinforce the logic 0 on the node B. Likewise, if the voltage written to the node B is 4V and the voltage written to the node A is 0V, the positive-feedback configuration ensures that the cell will store a logic 0.

The 4-T SRAM cell 100 includes conventional passive loads 114 and 116 that pull up the voltage at one of the nodes A or B if the associated NMOS pull-down transistor for that node is inactive. Polysilicon resistors form these passive loads 114 and 116 in one embodiment. The loads 114 and 116 are usually built in another level above the access transistors 102 and 104 and the NMOS pull-down transistors 110 and 112. Thus, the 4-T SRAM cell occupies a relatively small area, which results in increased density. However, complex steps are required to form the load elements 114 and 116, which increases fabrication cost, such that the construction of the 4-T SRAM cells presents a complexity versus density tradeoff. Additionally, the high resistance values of the loads 114 and 116 can substantially lower the stability margin of the cell 100 because the impedance ratio of the loads 114 and 116 and the voltage threshold $V_{TN}$ of the NMOS pull-down transistors 110 and 112 produce a large voltage drop across the loads 114 and 116. Thus, the 4-T SRAM cell 200 can inadvertently become monostable or read unstable instead of maintaining a desired bistable characteristic. Also, the 4-T SRAM cell 100 consumes a considerable amount of standby power because there is always current flowing from $V_{DD}$ to $V_{SS}$ either through the load 114 and the NMOS pull-down transistor 110 or through the load 116 and the NMOS pull-down transistor 112. Further, as will be described below, each of the resistive load inverters within the 4-T SRAM cell has asymmetrical transients.

FIG. 2 is a circuit diagram of a conventional 6-T SRAM cell 200. Rather than using passive pull-up loads 114 and 116 as does the 4-T SRAM cell 100 of FIG. 1, the 6-T SRAM cell 200 uses PMOS pull-up transistors 218 and 220 in conjunction with the NMOS pull-down transistors 210 and 212 to form the storage circuit 209. For example, during a write of a logic 1 to the 6-T SRAM cell 200, the transistors 202 and 204 are activated as discussed above, and a logic 1 is driven onto the digit line 206 and a logic 0 is driven onto the digit line 208. Thus, in an embodiment where $V_{DD}$=5V, the transistor 202 couples 4V (the 5V on the digit line 206 minus the 1V threshold of the transistor 202) to the node A, and the transistor 204 couples 0V from the digit line 208 to the node B. The low voltage on the node B turns off the NMOS pull-down transistor 210, and turns on the PMOS transistor 218. Thus the inactive NMOS transistor 212 allows the PMOS transistor 218 to pull the node A up to 5V. This high voltage on the node A turns on the NMOS transistor 212 and turns off the PMOS transistor 220, thus allowing the NMOS transistor 212 to reinforce the logic 0 on the node B. Likewise, if the voltage written to the node B is 4V and that written to the node A is 0V, the positive-feedback configuration ensures that the 6-T SRAM cell 200 will store a logic 0.

Because the PMOS transistors 218 and 220 have low on resistances (typically on the order of a few kOhms) and quick transient responses, they can pull the respective nodes A and B virtually all the way up to $V_{DD}$ often in less than 10 nanoseconds (ns), and thus render the 6-T SRAM cell 200 relatively stable and allow the cell 200 to operate at a lower supply voltage than the 4-T SRAM cell 100 of FIG. 1. In contrast to the 4-T SRAM cell 100, the power consumption is rather low for the 6-T SRAM cell 200 as the current flow from $V_{DD}$ to $V_{SS}$ is always blocked by one of the NMOS/PMOS pairs. However, the six transistor CMOS design causes the 6-T SRAM cell 200 to be approximately 30% to 40% larger than the NMOS design of the 4-T SRAM cell 100, and thus causes the 6-T SRAM cell 200 to consume more chip surface area and be more costly to fabricate. The problems associated with the 4-T SRAM cell 100 and the 6-T SRAM cell 200 have led to the development of the LL4TCMOS SRAM cell.

FIG. 3 is a circuit diagram of a conventional LL4TCMOS SRAM cell 300. A difference between the LL4TCMOS SRAM cell 300 of FIG. 3 and the 4-T SRAM cell 100 of FIG. 1 is the elimination of the load elements 114 and 116 and the replacement of NMOS access transistors 102 and 104 with PMOS access transistors 322 and 324. The LL4TCMOS SRAM cell 300 is relatively small, but is larger than the 4-T SRAM cell 100 as it incorporates PMOS transistors to form CMOS devices.

The conventional LL4TCMOS SRAM cell 300 design suffers from stability margin problems under low voltage operation. The relationship between the size of the access transistors 322 and 324 and the size of the pull-down transistors 310 and 312 is a factor in SRAM cell 300 design, and is referred to as the Beta ratio. The Beta ratio is the ratio of the Beta for the PMOS access transistors 322 and 324 and the NMOS pull-down transistors 310 and 312. The Beta ratio implies an impedance ratio that affects the available voltage at nodes A and B, and thus the margins of failure for the cell 300. A stability failure can occur because of the effect of leakage currents in the SRAM cell and the effect of noise.

Leakage currents are generated by the NMOS pull-down transistors 310 and 312 when they are inactive or in the off state. One of the two transistors 310 or 312 always will be inactive as they are cross-coupled to form the storage circuit 309. The cell 300 may flip states if one of the nodes A or B loses enough charge. In order to prevent the LL4TCMOS SRAM cell 300 from losing charge at one of the nodes A or B and from spontaneously changing state as a result, the PMOS access transistors 322 and 324 must source sufficient current from the digit lines 306 and 308 to offset the leakage currents. The required offset current can vary over many orders of magnitude due to temperature and process variations. The parasitic leakage current may rise approximately 1.3 mV per degree C., for example. If the NMOS pull-down transistors 310 and 312 have a high threshold voltage $V_{TN}$ to minimize leakage current, the SRAM cell 300 may lose its stability margin, i.e. the write noise margin. If the transistors 310 and 312 have a low threshold voltage $V_{TN}$, the leakage current is too large at hot temperatures, which may result in data retention failures.

Figure 4:
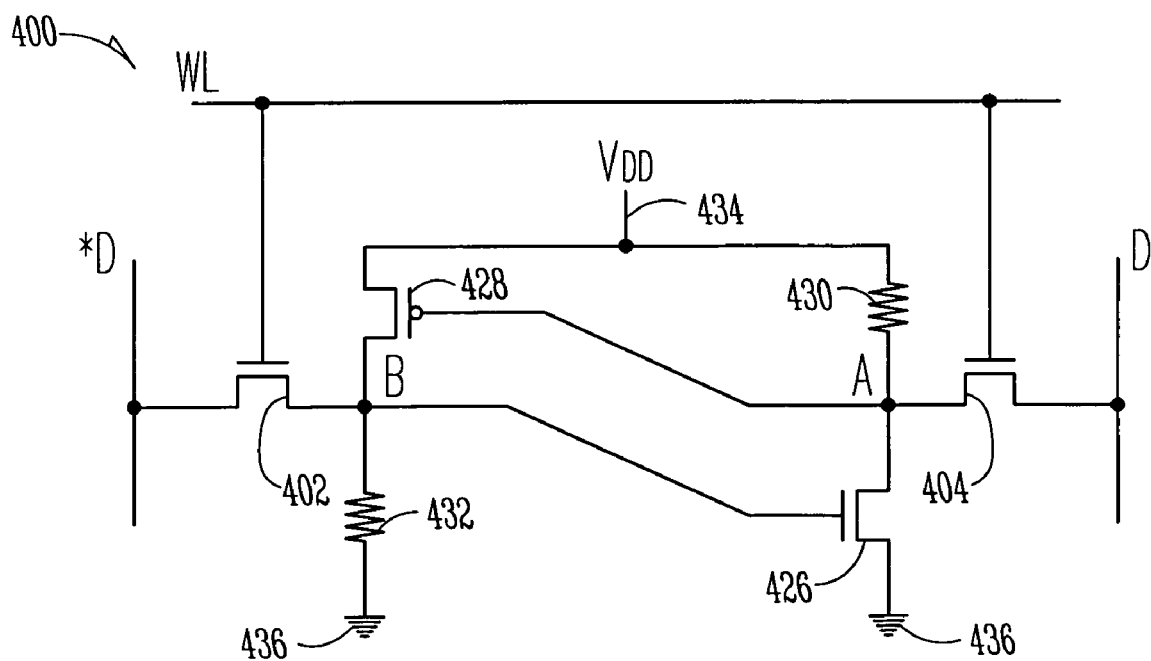
FIG. 4 illustrates a four transistor SRAM cell with a cross-coupled NMOS transistor and PMOS transistor and with two access transistors.

FIG. 4 illustrates a four transistor SRAM cell with a cross coupled NMOS and PMOS transistor and with two access transistors. U.S. application Ser. No. 09/651,632 filed on Aug. 30, 2000, now issued as U.S. Pat. No. 6,275,433 and entitled FOUR TRANSISTOR SRAM CELL WITH IMPROVED READ ACCESS, assigned to Applicant's assignee, provides a description of this SRAM cell and is hereby incorporated by reference.

The SRAM cell 400 includes a cross coupled NMOS transistor 426 and PMOS transistor 428, two resistors 430 and 432, and two access transistors 402 and 404 that couple the cell to complementary bit lines D and *D. The NMOS transistor 426 and the resistor 430 are coupled in series between a first power supply potential 434 and a second power supply potential 436. The NMOS transistor 426 and the resistor 430 form an NMOS resistive load inverter. The PMOS transistor 428 and the resistor 432 are coupled in series between the power supply potential 434 and the second power supply potential 436. The PMOS transistor 426 and the resistor 432 form a PMOS resistive load inverter. In the illustrated embodiment, the first power supply potential 434 is a positive power supply potential or $V_{DD}$, and the second power supply potential 436 is an electrical ground potential or $V_{SS}$. Throughout the remainder of this description, it will be assumed that the first and the second power supply potentials 434 and 436 are realized as positive and ground potentials, respectively. Other power supply potentials may be substituted for the positive potential and ground potential in other embodiments.

A gate terminal of the transistor 426 is coupled to node B between the transistor 428 and the resistor 432, and a gate terminal of the transistor 428 is coupled to node A between the transistor 426 and the resistor 430. An actuated transistor 426 conducts current and serves to maintain the voltage at node A at or near the ground potential, and an actuated transistor 428 conducts current and serves to maintain the voltage at node B at or near the power supply potential 434. An actuated transistor 426 and the resistor 430 form a DC current path between the power supply potential 434 and the ground potential 436, and an actuated transistor 428 and the resistor 432 form a DC conductive path between the power supply potential 434 and the ground potential 436. No DC current path exists in the cell when the transistors 426 and 428 are not actuated, i.e. when the transistors are in their non-conducting states.

The cell 400 is bistable. In one stable state, both transistors 426 and 428 are conducting current, i.e. are actuated; and in the other stable state, both transistors 426 and 428 are non-conducting, i.e. are not actuated. Thus, the cell 400 is capable of storing a datum of information as represented by one of the two possible stable states of the cell. In one state, node B will be at or near the ground potential 436 or logic 0 and node A will be at or near the power supply potential 434 or logic 1. In this state, the transistors 426 and 428 are both in their non-conducting states. This state, in which the transistors are "off," is designated herein as a logical 1 for this cell 400 as node A, which is coupled to the bit line D, is at a logic 1. In a second state of the cell, node B will be at or near the power supply potential 434 or logic 1, and node A will be at or near the ground potential 436 or logic 0. In this state, the transistors 426 and 428 are both in their conducting states. This state, in which the transistors are "on," is designated herein as a logical 0 for this cell 400 as node A, which is coupled to the bit line D, is at a logic 0.

If the cell 400 stores a logical 1, node B will be at or near the ground potential. Because node B is coupled to the gate of the NMOS transistor 426, the transistor 426 will be in a non-conducting state. In that state, the transistor 426 cannot discharge any potential at node A to the ground potential 436. Also because the cell 400 is storing a logical 1, node A will be at or near the power supply potential 434. Because node A is coupled to the gate of the PMOS transistor 428, the transistor 428 will be in its non-conducting state as well. In this non-conducting state, the transistor 428 will be prevented from pulling the voltage at node A toward the power supply potential 434. In this logical 1 state, no DC current path exists in the cell 400.

Figure 5:
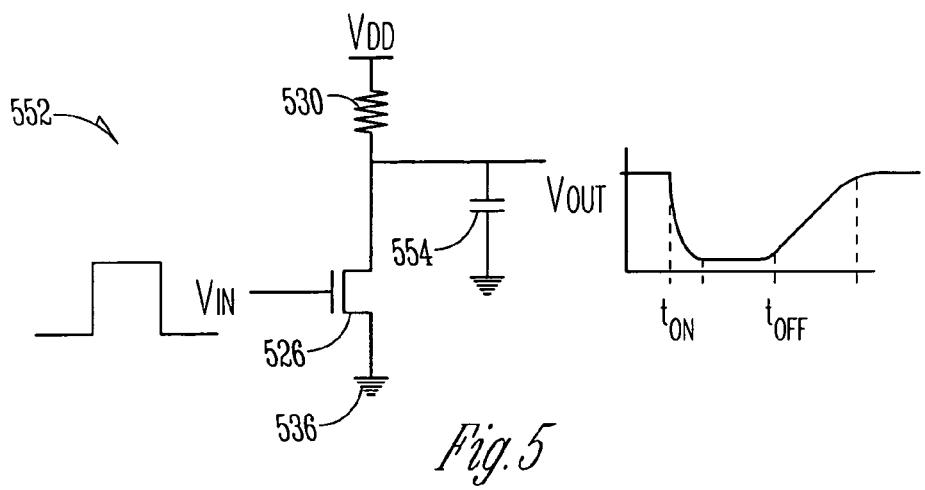
FIG. 5 illustrates the asymmetrical switching transients of resistive load inverters.
Figure 6:
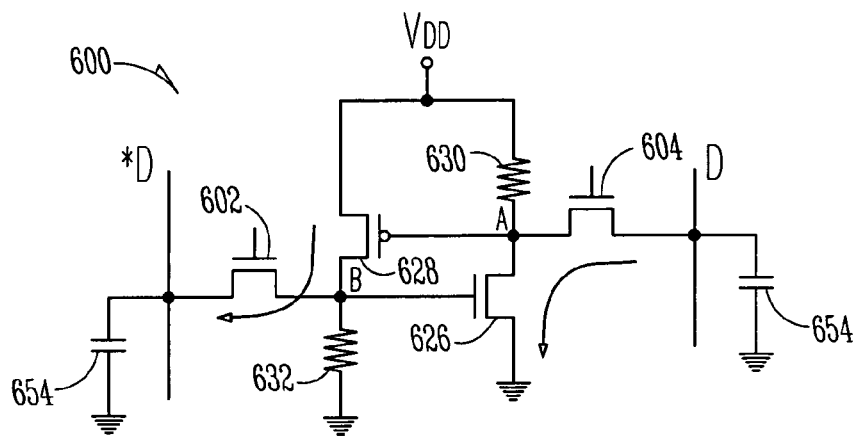
FIG. 6 illustrates the resistive load inverters incorporated in the SRAM cell of FIG. 4 making a transition to a logical state 0, wherein the current flow through the transistors provides a relatively fast response.
Figure 7:
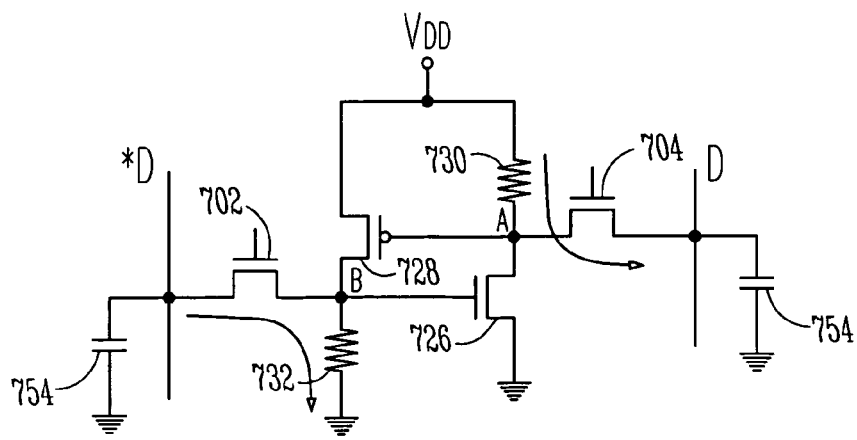
FIG. 7 illustrates the resistive load inverters incorporated in the SRAM cell of FIG. 4 making a transition to a logical state 1, wherein current flow through the resistors provides a relatively slow response.

FIGS. 5, 6 and 7 illustrate the asymmetrical switching transients of resistive load inverters, particularly with respect to the PMOS resistive load inverter and the NMOS resistive load inverter incorporated in the SRAM cell of FIG. 4. FIG. 5 illustrates that a logical transition, during time $t_{ON}$, that causes current to flow through the transistor of a resistive load inverter is faster than a logical transition, during time $t_{OFF}$ that requires current to flow through the resistor of the resistive load. FIG. 6 illustrates that current flows through the transistors of the resistive load inverters when the SRAM cell makes a transition to a first state, and FIG. 7 illustrates that current flows through the resistors of the resistive load inverters when the SRAM cell makes a transition to a second state.

FIG. 5 illustrates the asymmetrical switching transients of resistive load inverters 552. The illustrated resistive load inverter 552 is an NMOS resistive load inverter as it includes an NMOS transistor 526 and a pull-up load resistor 530. The asymmetrical switching nature of a resistive load inverter 552 also applies to a PMOS resistive load inverter that includes a PMOS transistor and a pull-down load resistor. The illustrated load inverter 552 also includes a capacitor 554 at the output node that is used to model an output line capacitance for an inverter or the gate of a second transistor in a cross coupled memory cell. The time required to pull the output voltage $V_{OUT}$ low is the time required to fully turn on the NMOS transistor 526 and drain current to the ground reference potential 536, and is illustrated in the graph as the relatively short period $t_{ON}$. The time required to pull the output voltage $V_{OUT}$ high is the time required for current to flow through the resistor 530, and is illustrated in the graph as the relatively long period $t_{OFF}$. Therefore, a transition in which current flows through the resistor 530 takes longer than a transition in which current flows through the transistor 526. Because the SRAM cell of FIG. 4 includes a PMOS resistive load inverter and an NMOS resistive load inverter, it is asymmetrical. The response time for the sensing operating depends on which of the two stable states exists in the cell since a transition to the logic 0 at node A causes current to flow through the transistors as illustrated in FIG. 6 and a transition to the logic 1 at node A causes current to flow through the resistors as illustrated in FIG. 7.

FIG. 6 illustrates the SRAM cell of FIG. 4 making a transition to a logical state 0 at node A. The circuit includes a pull-up PMOS transistor 628, a pull-down load resistor 632 for the PMOS transistor 628, a pull-down NMOS transistor 626, and a pull-up load resistor 630 for the NMOS transistor 626. Capacitors 654 model the line capacitance of the complementary bit lines D and *D. Node B is being pulled high or to a logic 1 because of the current flow through the PMOS transistor 628 and the access transistor 602; and node A is being pulled low or to a logic 0 because of the current flow through the access transistor 604 and the NMOS transistor 626. Therefore, the transition to the logic state 0 at node A for the cell 600, and thus the access time to the cell 600 in this state, is fast because the current flows through both of the transistors 626 and 628 and through neither of the resistors 630 and 632.

FIG. 7 illustrates the SRAM cell of FIG. 4 making a transition to a logical state 1 at node A. The circuit includes a pull-up PMOS transistor 728, a pull-down load resistor 732 for the PMOS transistor 728, a pull-down NMOS transistor 726, and a pull-up load resistor 730 for the NMOS transistor 726. Capacitors 754 model the line capacitance of the complementary bit lines D and *D. Node B is being pulled low or to a logic 0 because of the current flow through the access transistor 702 and the pull-down load resistor 732; and node A is being pulled high or to a logic 1 because of the current flow through the pull-up resistor 730 and the access transistor 704. When the transistors 726 and 728 are non-conducting, the resistor 730 will attempt to pull the bit line D up while the resistor 732 will attempt to pull the complementary bit line *D down. This situation, as compared to the transistors in their conducting states, provides the slower read response.

Figure 8:
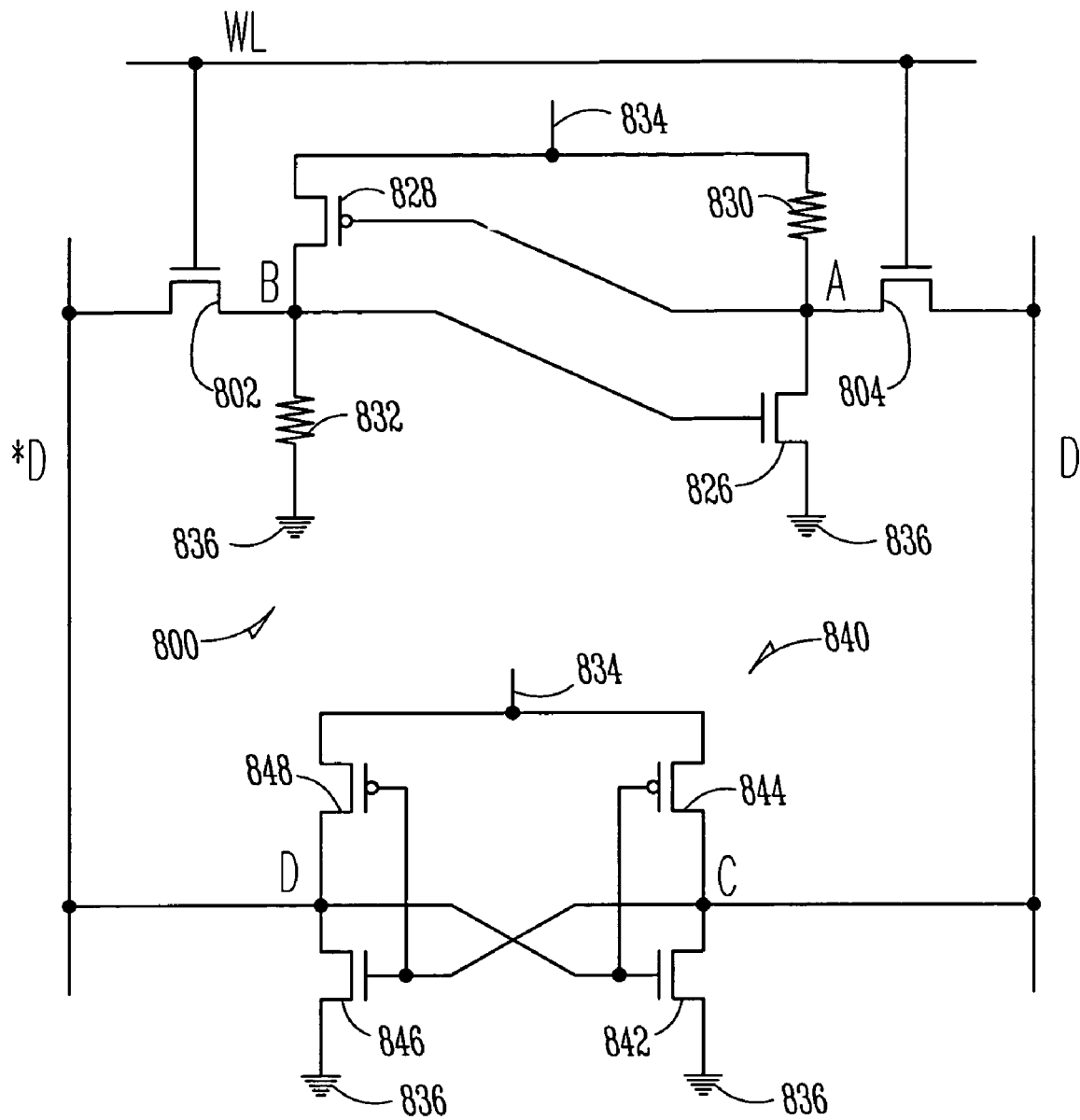
FIG. 8 illustrates the SRAM cell of FIG. 4 combined with a conventional cross-coupled sense amplifier.
Figure 9:
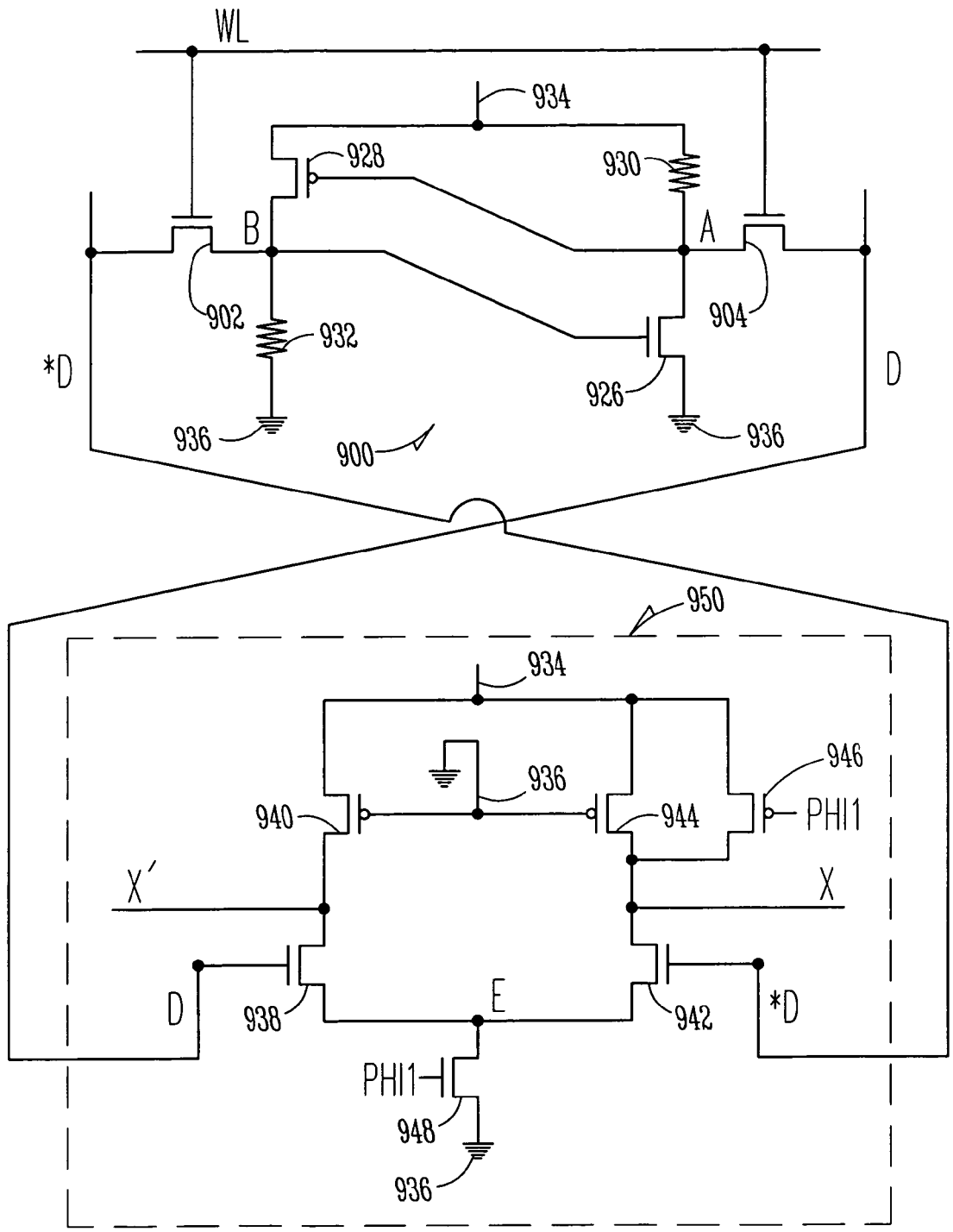
FIG. 9 illustrates the SRAM cell of FIG. 4 combined with a sense amplifier that provides a predicted output memory sense scheme.

FIG. 8 illustrates the SRAM cell 400 of FIG. 4 combined with a conventional cross-coupled sense amplifier 840, and FIG. 9 illustrates the SRAM cell 400 of FIG. 4 combined with a sense amplifier 950 that provides a predicted memory output sense scheme. The SRAM cell 800, the conventional cross-coupled sense amplifier 840, and the sense amplifier 950 with a predicted memory output sense scheme are disclosed in U.S. application Ser. No. 09/651,632, now U.S. Pat. No. 6,275,433.

FIG. 8 illustrates the SRAM cell 800 of FIG. 4 combined with a conventional cross-coupled sense amplifier 840. If the SRAM cell 800 is to be "read" when the SRAM cell 800 is in a logical 1 state at node A using the conventional sense amplifier 840 arrangement, the bit line D and the complementary bit line *D will each be pre-charged to a value of approximately one-half the power supply potential 834. An access signal will be provided on the word line WL to actuate the access transistors 804 and 802 to couple the cell 800 to the bit line D and the complementary bit line *D, respectively. At that time, because the NMOS transistor 826 is non-conducting, or essentially non-conducting, node A and thus the bit line D will be pulled toward the power supply potential 834 through the resistor 830. At the same time, because the PMOS transistor 828 is non-conducting, or essentially non-conducting, the potential at node B, and thus the potential on the complementary bit line *D, will be pulled toward the ground potential 836 through the resistor 832. In this manner, a differential voltage will appear between the bit line D and the complementary bit line *D. That differential voltage is amplified using the sense amplifier 840.

If the cell stores a logical 0 at node A, node B will be at or near the power supply potential 834, and node A will be at or near the ground potential 836. Here, the NMOS transistor 826 will be in its conducting state, maintaining the potential at node A at or near the ground potential 836. The PMOS transistor 828 will also be in its conducting state, maintaining the voltage at node B at or near the power supply potential 834. In this state, one DC current path flows through the transistor 826 and the load resistor 830, and a second DC current path flows through the transistor 828 and the load resistor 832. Larger resistor values make the cell more sensitive to being upset due to noise and sub-threshold leakage, yet result in less power dissipation. The resistors 830 and 832 are sized to optimize the tradeoff between cell stability and power dissipation.

The conventional sense amplifier 840 includes an NMOS transistor 842 and a PMOS transistor 844 coupled in series between a power supply potential 834 and a ground potential 836. The sense amplifier 840 also includes an NMOS transistor 846 and a PMOS transistor 848 coupled in series between the power supply potential 834 and the ground potential 836. A gate of the NMOS transistor 842 is coupled to a gate of the PMOS transistor 844, and the gates of the transistors 842 and 844 are coupled to node D between the transistor 846 and the transistor 848. A gate of the NMOS transistor 846 is coupled to a gate of the PMOS transistor 848, and the gates of the transistors 846 and 848 are coupled to node C between the transistor 842 and the transistor 844.

U.S. application Ser. No. 09/651,632, now U.S. Pat. No. 6,275,433, discloses a process for reading a datum from the cell 800 in which the bit line D and complementary bit line *D are each pre-charged to a value of $V_{DD}/2$ or approximately one-half the power supply potential 834. Thereafter, the sense amplifier 840 magnifies potential differences induced on the bit line D and complementary bit line *D by the action of the cell 800. The SRAM cell 800 is asymmetrical because of the complementary nature of the PMOS resistive load inverter and the NMOS resistive load inverter. Thus, the response time for the sensing operation depends on which of the two stable states exist in the cell 800, wherein the slower response time occurs when current flows through the resistors of the NMOS and PMOS resistive load inverters.

U.S. application Ser. No. 09/651,632, now U.S. Pat. No. 6,275,433, also describes a method for compensating for the asymmetrical nature of the SRAM cell; i.e. the nature that causes the read response time for the cell to be slower when the cell stores a logical 1 datum at node A than when the cell stores a logical 0 datum at node A. The logical 1 state of the cell represents that state in which both of the transistors are non-conducting in which node A is at a high potential and node B is at low potential. The logical 0 state of the cell represents that state in which both of the transistors are conducting in which node A is at a low potential and node B is at a high potential.

FIG. 9 illustrates the SRAM cell of FIG. 4 combined with a sense amplifier 950 that provides a predicted output memory sense scheme. A very fast read access can be achieved by incorporating a predicted output memory scheme since the bit lines D and *D and sense amplifiers 950 only change state if both transistors 926 and 928 are "on" in the cell 900. As described above with respect to FIGS. 5, 6 and 7, a transition or read operation that requires current to flow through the resistors 930 and 932 is slower than a transition or read operation that requires current to flow through the transistors 926 and 928. The combination of the SRAM cell of FIG. 4 with a "predicted output" sensing arrangement causes the access time for the slower transition to be essentially zero. The access delay in the other state involves the quicker of the two transitions. The net result is a very fast read access.

When the cell 900 is to be coupled to the sense amplifier 950 for sensing the state of the cell 900, the bit line D will be pre-charged to a high potential, and the complementary bit line *D will be pre-charged to a low potential (essentially ground potential). In other words, the bit line D and the complementary bit line *D are pre-charged to a state that would be the result obtained in the event a logical 1 is stored at node A in the cell 900. That is, the output at node A will be predicted to be a logical 1. When the cell 900 is coupled to the pre-charged bit line D and complementary bit line *D, and if a logical 1 is stored in the cell 900, no charging of the bit line D through the resistor 930 or discharging of the complementary bit line *D through the resistor 932 will be necessary. If a logical 0 is stored at node A in the cell 900, the bit line D will be discharged through the transistor 926, and the complementary bit line *D will be charged through the transistor 928. The time required to discharge and charge, respectively, the capacitive loads of the bit line D and the complementary bit line *D through the transistors 926 and 928 is much less than the time required to charge and discharge, respectively, the bit line D and the complementary bit line *D through the resistors 930 and 932.

The sense amplifier 950 is coupled to the bit line D and the complementary bit line *D, and provides outputs X and X' that are coupled to driver amplifiers (not shown). The sense amplifier 950 includes an NMOS transistor 938 coupled in series with a PMOS transistor 940 between a power supply potential and node E. An NMOS transistor 942 is coupled in series with a PMOS transistor 944 between the power supply potential and node E. A PMOS transistor 946 is coupled in parallel to the PMOS transistor 944. The gates of the PMOS transistors 940 and 944 are coupled to a ground potential 936. Thus, the PMOS transistors 940 and 944 are maintained in their conducting states. The PMOS transistor 946 is biased at its gate by a clock signal PHI1. The PMOS transistor 946 provides a pre-charge function, enabling the pre-charge of the node corresponding to the output X to a high potential. Node E is coupled to a ground potential through an NMOS transistor 948 that is biased at its gate by the clock signal PHI1.

Because the switching transients on the NMOS and PMOS resistive load inverters in cell 900 are asymmetrical, the transient where the active transistors 926 and 928 are discharging and charging the capacitive lines is almost an order of magnitude shorter in time than the transient where the load resistors 930 and 932 charges and discharges the capacitive lines. As a result of the fully differential signal and the faster charging transients when the transistors 926 and 928 are both conducting, the output of the sense amplifier 950 takes only about 1.0 nanoseconds to change by 0.25 volts. This is about three times faster than that for a conventional operation using the conventional sense amplifier 840 shown in FIG. 8. Thus, combining the SRAM cell with the "predicted output" sense amplifier with clocked sense amplifiers results in very fast read access times. The nodes corresponding to the outputs X and X' of the sense amplifiers, as well as any driver amplifiers, are preferably pre-charged so that the only transition possible is the faster transition.

FIGS. 10–13 illustrate a merged structure SRAM cell according to the present invention. This merged structure SRAM cell includes a PMOS resistive load inverter and an NMOS resistive load inverter. The merged structure SRAM cell can replace the transistors 426 and 428 and the resistors 430 and 432 in the SRAM cell of FIG. 4. Additionally, the merged structure SRAM cell can be used with new read and write techniques to form a two transistor SRAM cell, as will be discussed below with respect to FIGS. 14–19.

Figure 10:
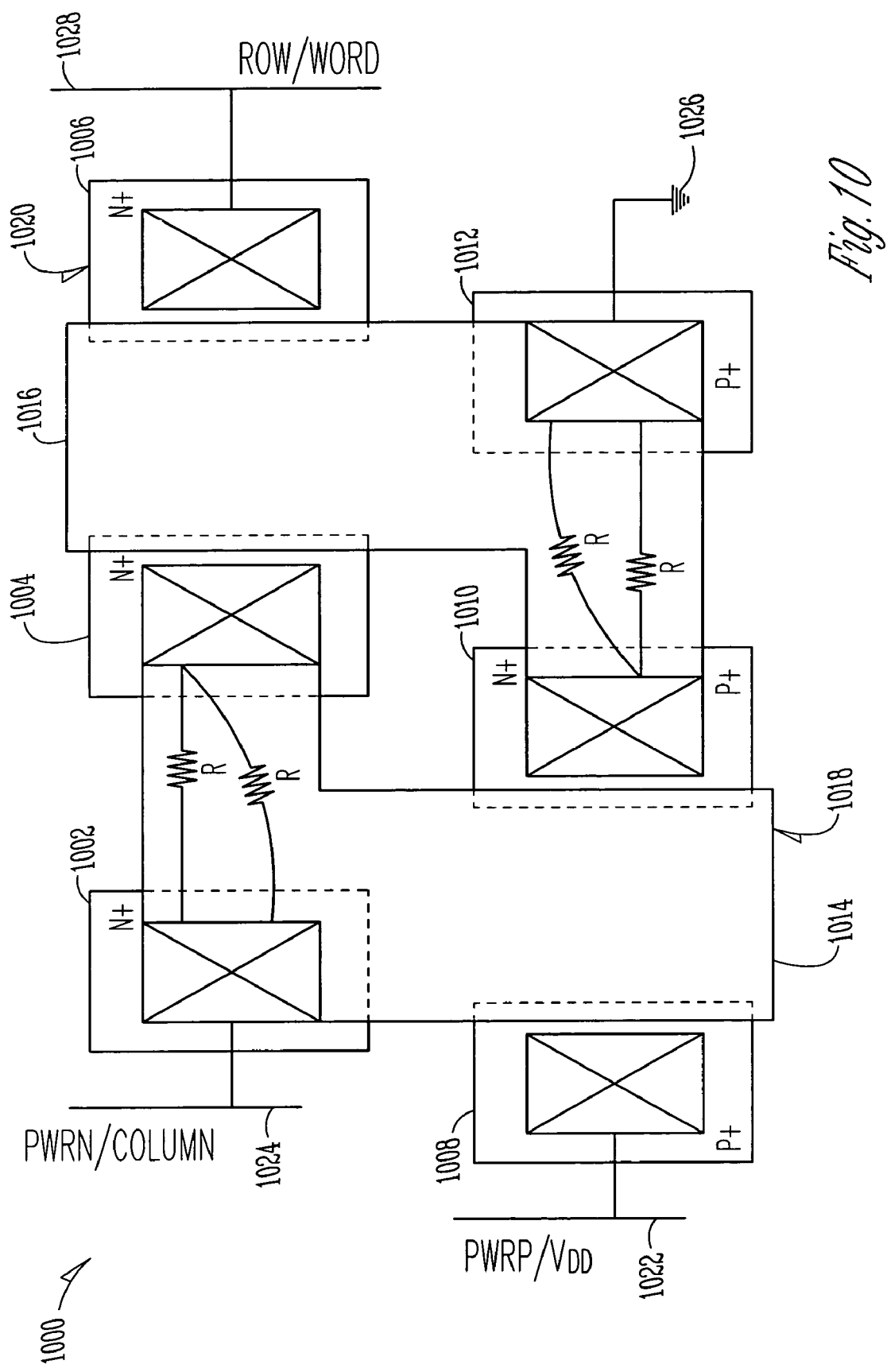
FIG. 10 is a top view of a horizontal merged structure SRAM cell according to the present invention.
Figure 11:
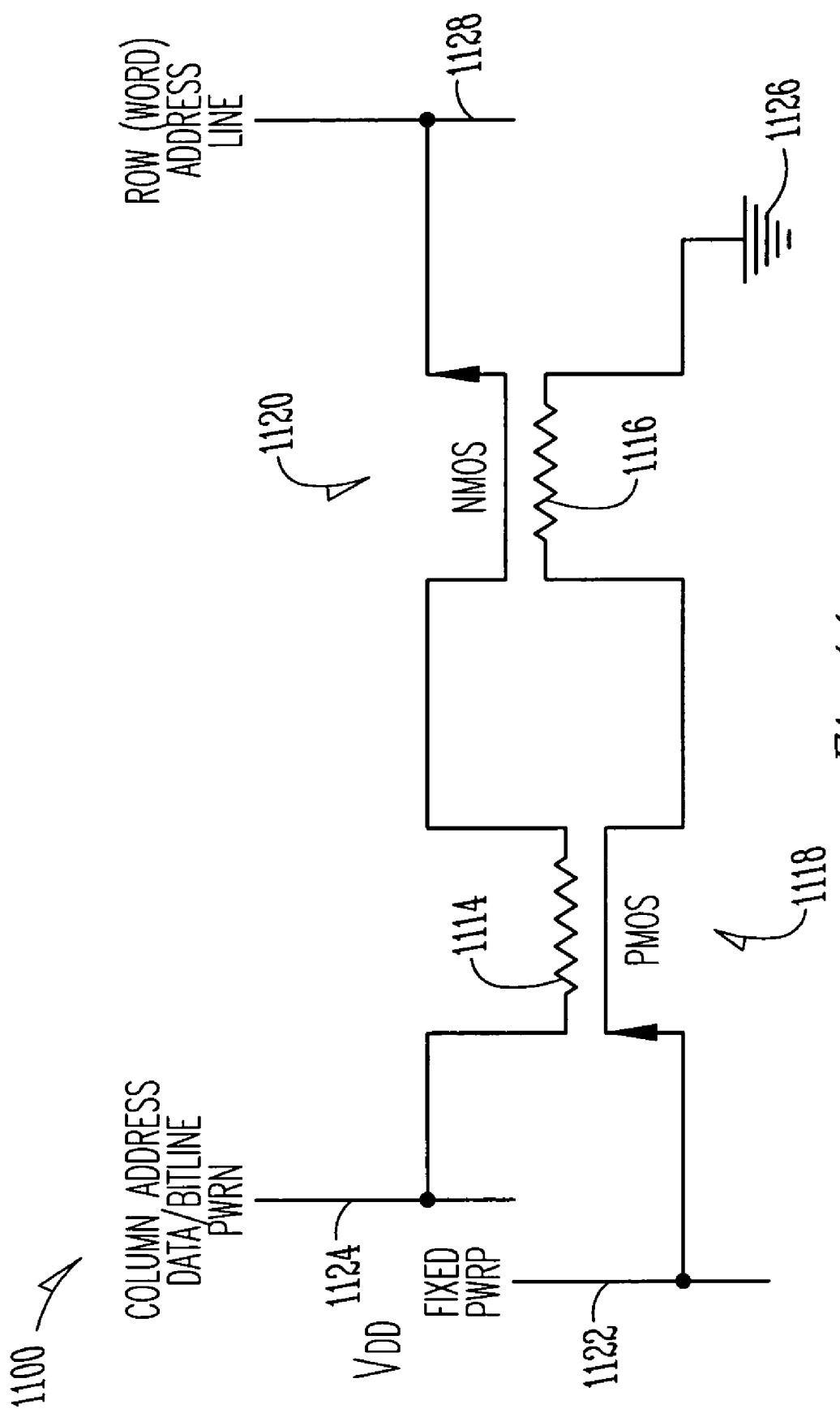
FIG. 11 is a schematic illustration for the merged structure SRAM cell of FIG. 10.

FIG. 10 illustrates a top view of a novel horizontal merged structure SRAM cell 1000 according to one aspect of the present invention, and FIG. 11 is a schematic illustration 1100 of the merged structure SRAM cell of FIG. 10. Referring to these figures together, one skilled in the art will understand that the gate of one of the transistors serves as the load resistor of the other transistor; i.e. the polysilicon gate of the PMOS transistor serves as the load resistor for the NMOS transistor and the polysilicon gate of the NMOS transistor serves as the load resistor for the PMOS transistor. Thus, the gate of the NMOS transistor is connected in series with the PMOS transistor, and the gate of the PMOS is connected in series with the NMOS transistor.

The horizontal merged structure SRAM cell 1000 of FIG. 10 is formed using CMOS technology, and includes a first N+ region 1002, a second N+ region 1004, a third N+ region 1006, a first P+ region 1008, and second P+ region 1010, and a third P+ region 1012. The two source/drain regions of a PMOS transistor 1018 are formed by the first P+ region 1008 and the second P+ region 1010. The two source/drain regions of an NMOS transistor 1020 is formed by the second N+ region 1004 and the third N+ region 1006. A first polysilicon layer 1014 is formed proximate to first and second P+ regions 1008 and 1010, and a second polysilicon layer 1016 is formed proximate to the second and third N+ regions 1004 and 1006. These polysilicon layers 1014 and 1016 form the gates of a PMOS transistor 1018 and an NMOS transistor 1020, respectively. The doping of these polysilicon layers 1014 and 1016 is lower than that which would typically be used for the gates in a CMOS process. The doping is of a sufficient level for the polysilicon to perform its dual functions; namely to function as a gate of the PMOS or NMOS transistor and to function as a load resistor. The first polysilicon layer 1014 is in contact with the first N+ region 1002 and the second N+ region 1004 to function as a load resistor for the NMOS transistor 1020; and the second polysilicon layer 1016 functions is in contact with the second P+ region 1010 and the third P+ region 1012 to function as a load resistor for the PMOS transistor 1018. The resistor symbols shown between the first N+ region 1002 and the second N+ region 1004 and shown between the second P+ region 1010 and the third P+ region 1012 are provided to illustrate the resistive quality or function of the polysilicon gate.

These merged structures perform dual functions; namely, the polysilicon layers function as a gate for one transistor and a load resistor for another transistor. The merging of circuit functions of transistors and resistors combined with some new read and write techniques, as discussed below, provide area-efficient cells. The SRAM cell 1000 illustrated in FIG. 10 is only a fraction of the area of the conventional planar 4T-SRAM cell 100 and 6T-SRAM cell 200 illustrated in FIGS. 1 and 2, respectively. The SRAM cell 1000, when combined with the new read and write techniques discussed below, provides a two transistor SRAM cell. Accounting only for the difference in the number of transistors, the two transistor SRAM cell 1000 would be one half of the area of the 4T-SRAM cell 100 of FIG. 1 or about one third of the area of the 6T-SRAM cell 200 of FIG. 2.

A first power line PWRP 1022 is connected to the first P+ region 1008 and a second power line PWRN 1024 is connected to the first N+ region 1002. A first reference potential line 1026 is connected to the third P+ region 1012 and a second reference potential line 1028 is connected to the third N+ region 1006. The illustrated embodiment shows that the PWRP line and the PWRN line are a fixed power supply line or $V_{DD}$ and a column line, respectively; and the reference potential lines 1026 and 1028 are a ground potential line or $V_{SS}$ and a row or word address line, respectively.

FIG. 11 is a schematic illustration 1100 of the merged structure SRAM cell of FIG. 10. This schematic illustration 1100 shows that the gate 1116 of the NMOS transistor 1120 is connected in series with the PMOS transistor 1118 between the $V_{DD}$ line 1122 and ground 1126, and that the gate 1114 of the PMOS transistor 1118 is connected in series with the NMOS transistor 1120 between the column line 1124 and the row line 1128.

Figure 12:
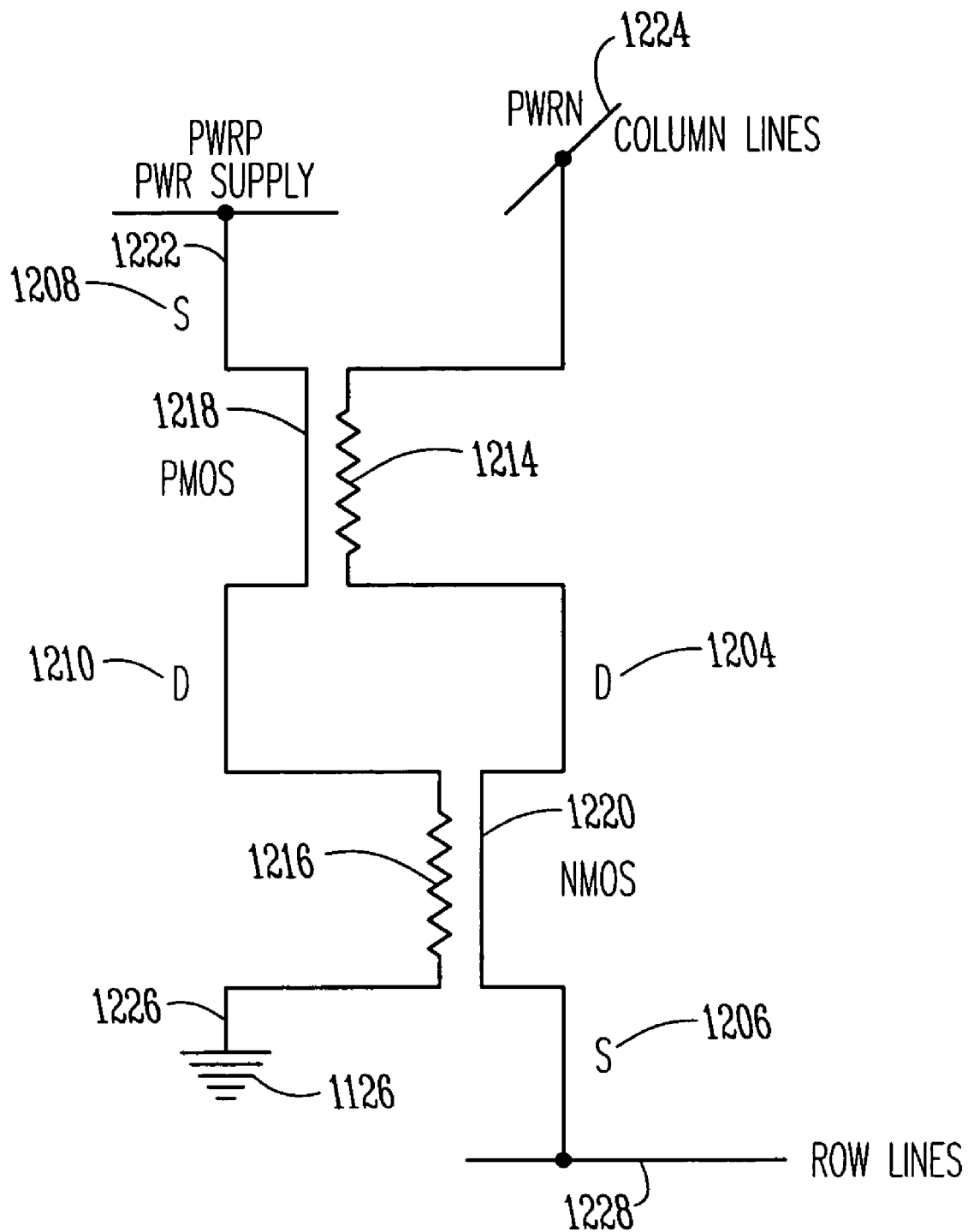
FIG. 12 illustrates an electrical equivalent for the merged structure SRAM cell of FIG. 10.

FIG. 12 illustrates an electrical equivalent for the merged structure SRAM cell of FIG. 10. This figure illustrates that the gate 1214 of the PMOS transistor 1218 is connected as a pull-up load resistor in series with the NMOS transistor 1220, i.e. the PMOS transistor gate 1214 is connected to the power line PWRN or column line 1224 and is connected to the drain 1204 of the NMOS transistor 1220. The source 1206 of the NMOS transistor 1220 is connected to a second reference line or row line 1228. This figure also illustrates that the gate 1216 of the NMOS transistor 1220 is connected as a pull-down load resistor in series with the PMOS transistor 1218, i.e. the NMOS transistor gate 1216 is connected to the first reference line or ground reference line 1226 and is connected to the drain 1210 of the PMOS transistor 1218. The source 1208 of the PMOS transistor 1218 is connected to the PWRP or $V_{DD}$ line 1222.

Figure 13:
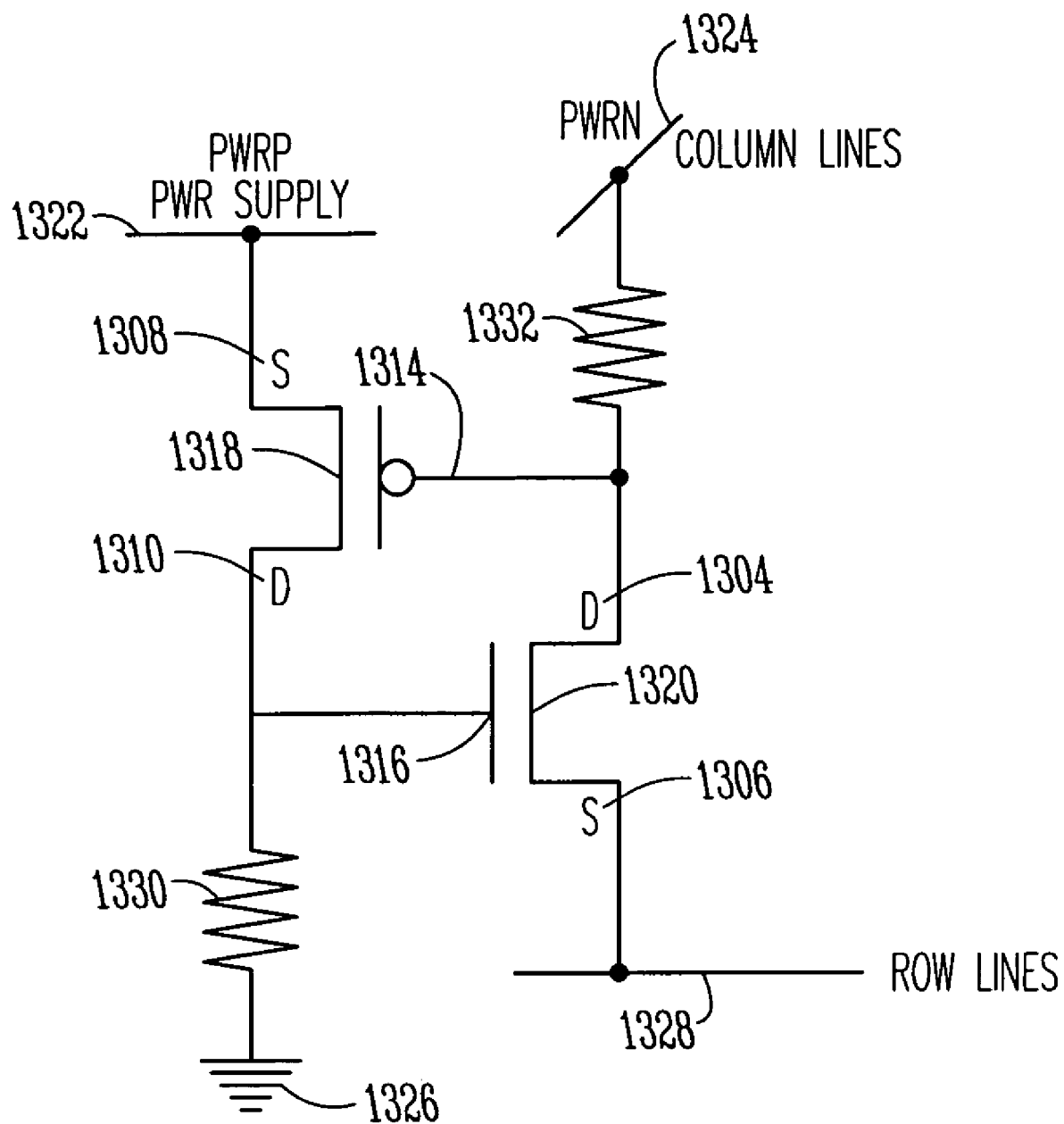
FIG. 13 illustrates another representation of the electrical equivalent of FIG. 12.

FIG. 13 illustrates another representation of the electrical equivalent of FIG. 12. As illustrated, a first source/drain region, i.e. source 1308, of the PMOS transistor 1318 is connected to a first power supply, i.e. PWRP or $V_{DD}$ 1322, and the polysilicon gate 1316 of the NMOS transistor 1320, which is functioning as a load resistor 1330 for the PMOS transistor 1318, is coupled between a second source/drain region, i.e. drain 1310, of the PMOS transistor 1318 and a first reference potential line, i.e. ground reference line 1326. A first source/drain region, i.e. source 1306, of the NMOS transistor 1320 is coupled to a row line 1328, and a second source/drain region, i.e. drain 1304, of the NMOS transistor 1320 is coupled to the polysilicon gate 1314 of the PMOS transistor 1318, which is functioning as a load resistor 1332 for the NMOS transistor 1320. The polysilicon gate 1314 of the PMOS transistor 1318 is also coupled to the second power supply, i.e. PWRN or column line 1324. The result is that the PMOS transistor 1318 and the polysilicon gate 1316 of the NMOS transistor 1320, which is functioning as the load resistor 1330 for the PMOS transistor 1318, are coupled in series between the first power supply PWRP 1322 and the ground reference line 1326 and form a PMOS resistive load inverter; and the NMOS transistor 1320 and the polysilicon gate 1314 of the PMOS transistor 1318, which is functioning as the load resistor 1332 for the NMOS transistor 1320, are coupled in series between the second power supply PWRN 1324 and the row line 1328 and form an NMOS resistive load inverter.

One of ordinary skill in the art will appreciate upon reading this disclosure that the electrical schematic of FIG. 13 includes a cross-coupled PMOS resistive load inverter and an NMOS resistive load inverter such as that incorporated in the SRAM cell of FIG. 4 without requiring the fabrication of separate resistive elements apart from the streamlined fabrication of the gates for the PMOS and NMOS transistors. Also, the merged SRAM cell 1000 does not require access transistors which are conventionally used for read and write operations for a memory cell. Rather, as will be described in detail below with respect to the novel read and write techniques, the read and write operations are accomplished by changing the power supply voltages, e.g. line 1324, and or ground potentials, e.g. line 1328, applied across one of the resistive load inverters in the cell, e.g. the NMOS resistive load inverter.

The present invention also provides novel techniques for reading and writing to two transistor SRAM cells such as the merged two transistor cell 1000 of FIG. 10. These techniques may also be used with the SRAM cell 400 structure of FIG. 4 without the two access transistors 402 and 404. The two power supply voltage lines, PWRN 1324 and PWRP 1322, and the two reference lines 1326 and 1328 can be independently changed to read or write the cell. An operational embodiment is provided below in connection with FIGS. 14 through 19. In one operational embodiment of the present invention, the PWRP power supply is fixed at 0.7V and functions as $V_{DD}$, the first reference line 1326 serves as a ground reference line, the PWRN power supply 1324 serves as the column or data/bit address line, and the second reference line 1328 serves as the row or word address line. Each row line is connected to a row potential generator and each column line is connected to a column potential generator, as the same will be known and understood by one of ordinary skill in the art, in order to provide an adjustable potential to the row line 1328 and the column line 1324, respectively.

Figure 14:
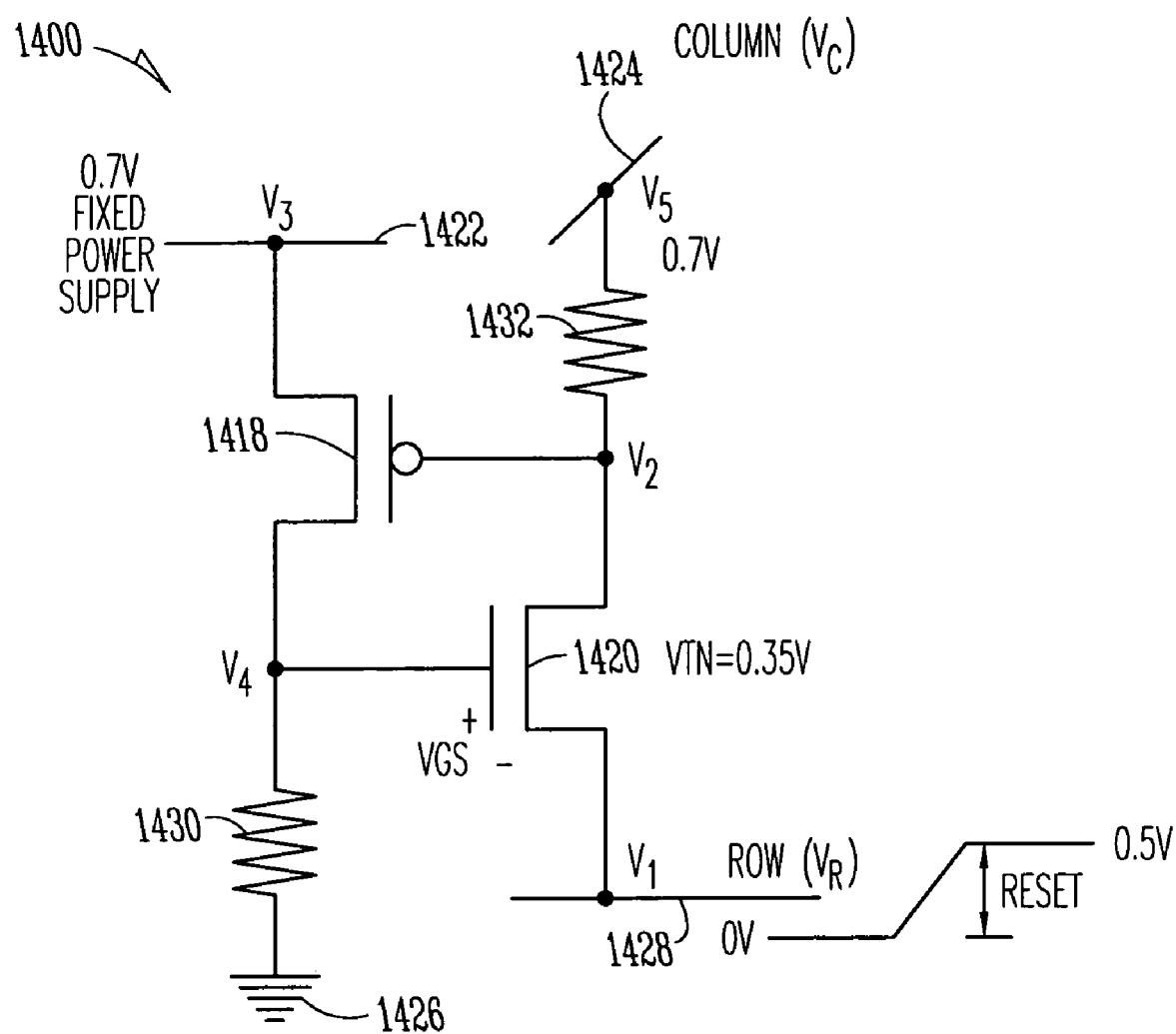
FIG. 14 illustrates a technique for resetting a row of two transistor SRAM cells to a logical 0 state, i.e. a state in which both transistors are off, according to the teachings of the present invention.

FIG. 14 illustrates a technique for resetting a row of two transistor SRAM cells, such as cell 1400, to a zero state or an off state when the transistors 1418 and 1420 are not conducting. The column line 1424 is connected to the cell 1400 and provides a node voltage $V_5$ of 0.7V. The power supply line $V_{DD}$ 1422 is connected to the cell 1400 and provides a constant node voltage $V_3$ of 0.7V. Therefore, $V_3=V_5=0.7V$. All of the cells for any particular row are reset or turned off by increasing the potential of the row address line 1428, which is connected to the source region of the NMOS transistor 1420 of cell 1400 and provides a node voltage $V_1$, above the threshold voltage $V_{TN}$ for the NMOS transistor 1420. For the purposes of this example, the threshold voltage $V_{TN}$ for the NMOS transistor 1420 is approximately 0.35V. Raising the row address line potential above 0.35V, such as 0.5V, turns the NMOS transistor 1420 "off" for every cell 1400 in the row 1428. When the NMOS transistor 1420 is off or not actuated, the load resistor 1432, i.e. the resistive function of the polysilicon gate of the PMOS transistor 1418, pulls up the node voltage $V_2$ to 0.7V. Again, the load resistor 1432 can be the polysilicon gate for the PMOS transistor 1418 as described in connection with the novel circuit of FIG. 10, or the load resistor 1432 can be an independent, separately fabricated load resistor, as present in connection with the cell structure of FIG. 4. The "high" node voltage $V_2$ causes the PMOS transistor 1418 to turn off since its gate to source voltage $V_{GS}$ will be zero and its threshold voltage $V_{TP}$ is −0.35V. The load resistor 1430, i.e. the resistive function of polysilicon gate of the NMOS transistor 1420, pulls down the node voltage $V_4$ to 0.0V, which maintains the NMOS transistor 1420 in an off or unactuated state when the potential $V_1$ of the row address line 1428 drops back down to around 0.0V.

Figure 15:
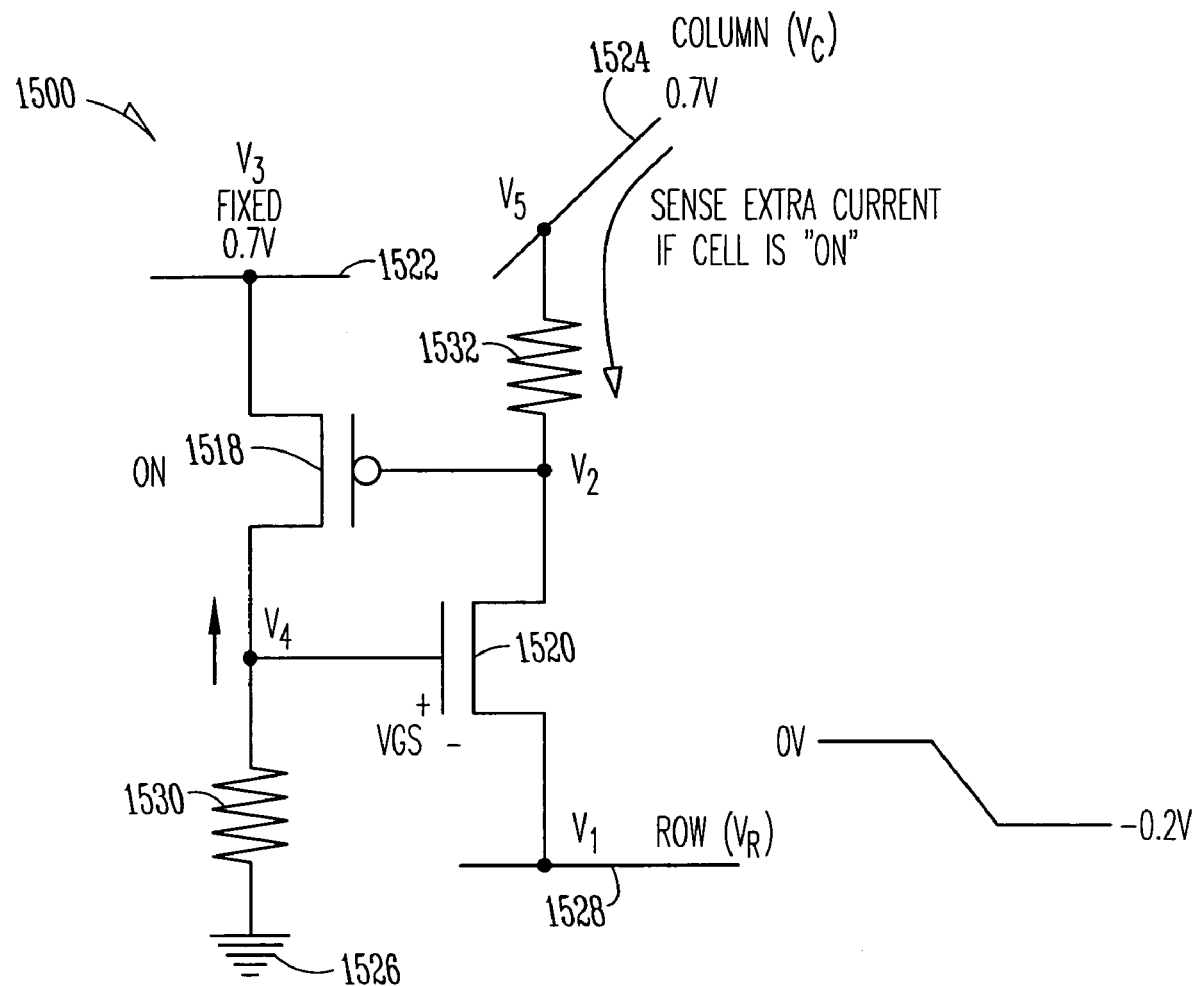
FIG. 15 illustrates a technique for reading a two transistor SRAM cell, according to the teachings of the present invention.

FIG. 15 illustrates a technique for reading a two transistor SRAM cell 1500. A read operation for a selected cell is performed by lowering the voltage potential $V_1$ of the row address or word line 1528 connected to the source region of the NMOS transistor 1520 (or connected to a source region of the NMOS transistor 426 present in the cell structure of FIG. 4) by an amount less than the threshold voltage $V_{TN}$ of the NMOS transistor 1520, i.e. the potential of the row line 1528 is lowered less than a 0.35V increment, such as about −0.2V. In response to the lower potential $V_1$ of the row line 1520, an NMOS transistor 1520 that is actuated or "on" conducts more current, but an NMOS transistor 1520 that is not actuated or off does not conduct additional current. Whether the NMOS transistor 1520 conducts or not will be determined by a stored potential level at node $V_2$. It is determined that the NMOS and PMOS transistors 1520 and 1518 are on if additional current is sensed on the column data bit line 1524. The stable state in which both transistors 1518 and 1520 are on can be deemed to be a logic 1 for the SRAM cell 1500, i.e. a logical 0 stored on node $V_2$. In other words, a read is performed by increasing the total voltage potential difference on the NMOS transistor side of the cell 1500, i.e. the difference between the column potential and the row potential applied across the NMOS resistive load inverter, by an incremental amount less than the NMOS threshold voltage $V_{TN}$ by lowering the row address line voltage $V_1$ below the ground reference potential 1526, and then determining if additional current is flowing on the data bit line or column line 1524. Again, load resistors 1532 and 1530 can consist of the polysilicon gates for the PMOS and NMOS transistors of the novel circuit of FIG. 10, or they can consist of independent separately, fabricated resistors as exist in the cell structure of FIG. 4. Only in FIG. 4, the word/row line will be connected to the source region of the NMOS transistor 426 and the bit/column line will be connected to the load resistor 430.

Figure 16A:
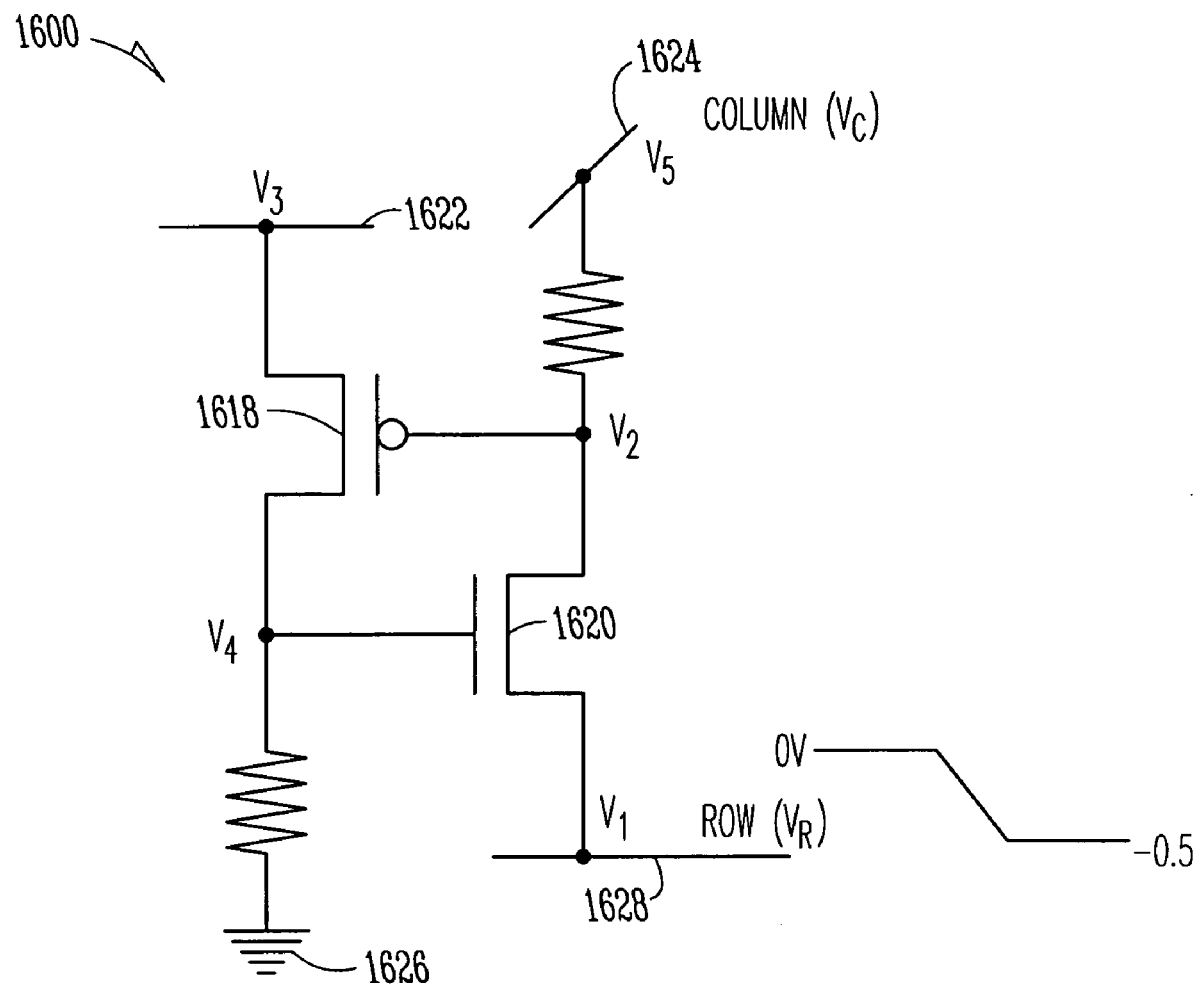
FIGS. 16a and 16b illustrate a technique for writing to a two transistor SRAM cell, according to the teachings of the present invention.
Figure 16B:
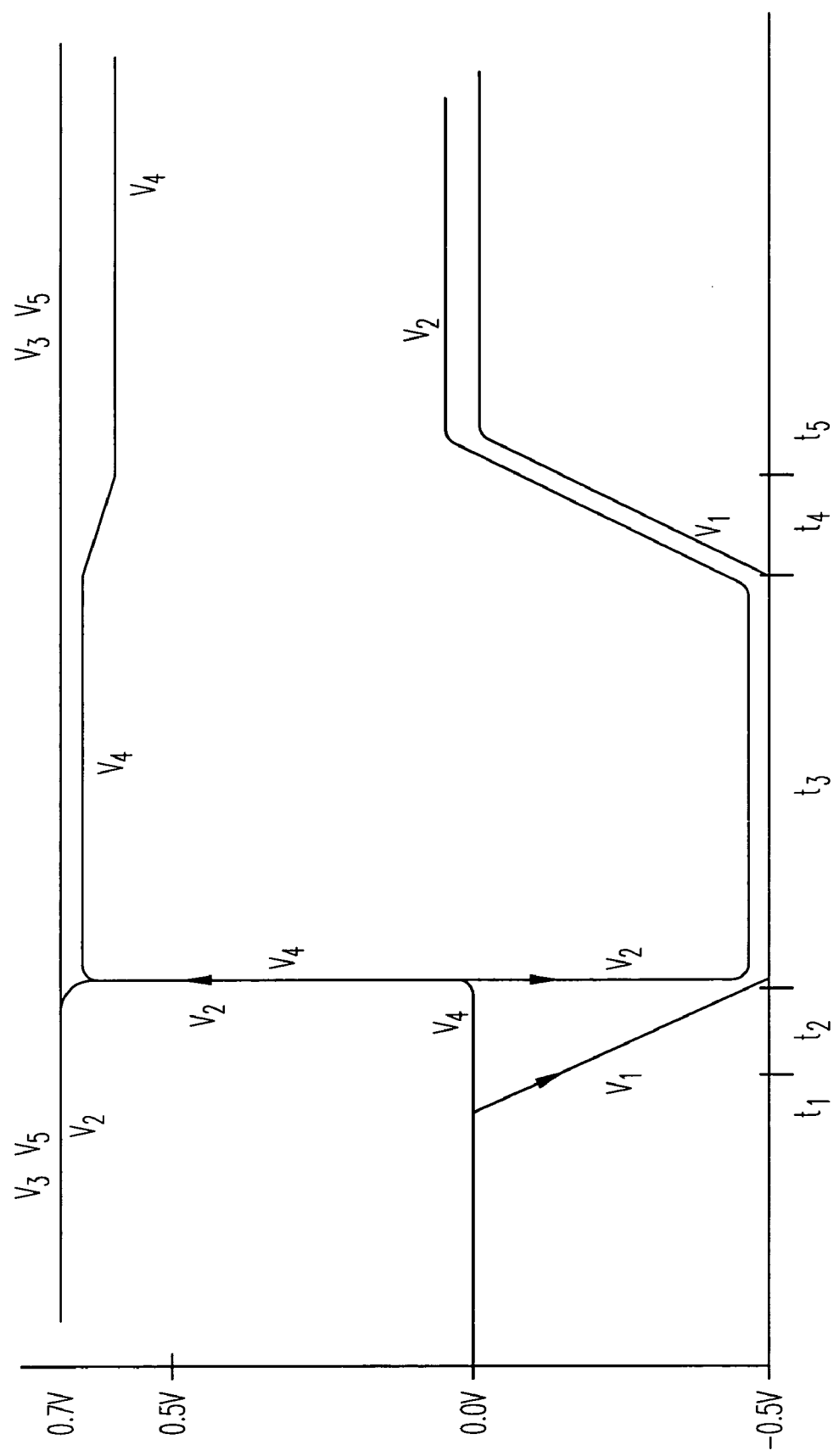

FIGS. 16a and 16b illustrates a technique for writing to a two transistor SRAM cell, i.e. "setting" the cell to an on or one state. FIG. 16a illustrates an electrical schematic for the two transistor SRAM cell 1600, and FIG. 16b shows the voltage potentials at the various node voltages $V_1$, $V_2$, $V_3$, $V_4$ and $V_5$ identified in FIG. 16a during a write operation. First, all of the cells 1600 in a row are reset to the off state, as previously described above and illustrated in FIG. 14. Next, the potential $V_3$ of the PWRP line 1622 provides a constant potential, which in this example is 0.7V. A write operation for a selected cell is performed by holding the potential $V_5$ (or $V_C$ for column line voltage) of the column line 1624 constant, i.e. 0.7V in this example, while stepping the potential $V_1$ (or $V_R$ for row line voltage) of the row line 1628 below the reference ground potential 1626 by an incremental amount greater than the NMOS threshold voltage $V_{TN}$, i.e. stepping the row potential down during time frame $t_2$ to about −0.5V, in this example, which causes the gate to source voltage of the NMOS transistor 1620 to be greater than the 0.35V threshold voltage $V_{TN}$ during time frame $t_3$. Thus, lowering the potential $V_1$ of the row line 1628 in time frame $t_2$ causes the NMOS transistor 1620 to turn on, which results in a low node voltage $V_2$ that turns on the PMOS transistor 1618 because the magnitude of the gate to source voltage is greater than that for the PMOS threshold voltage $V_{TP}$. Once the PMOS transistor 1618 is fully actuated, it raises the node voltage $V_4$ slightly below 0.7V at time frame $t_3$, and the node voltage V2 is pulled down slightly above −0.5V. Then the potential $V_1$ of the row line 1628 can go back to the steady state reference or ground potential without turning off the NMOS transistor 1620. In other words, a write is performed by holding the potential $V_5$ of the column line 1624 and PWRP 1622 constant at 0.7V and temporarily stepping the potential $V_1$ of the row line 1628 below the reference ground potential 1626 by an incremental amount greater than the NMOS threshold voltage $V_{TN}$, e.g. $V_1 \approx −0.5V$, to turn "on" the NMOS transistor 1620, and thus the PMOS transistor 1618, such that the NMOS and PMOS transistors 1620 and 1618 remain on after the potential $V_1$ of the row line 1628 rises again to a steady state ground potential which also allows node $V_2$ to return to a ground state or approximately 0.0V at time $t_4$. Thereafter, a logic value of logic 1 will be stored in the cell 1600 at node $V_4$ as shown at time frame $t_5$.

Figure 17A:
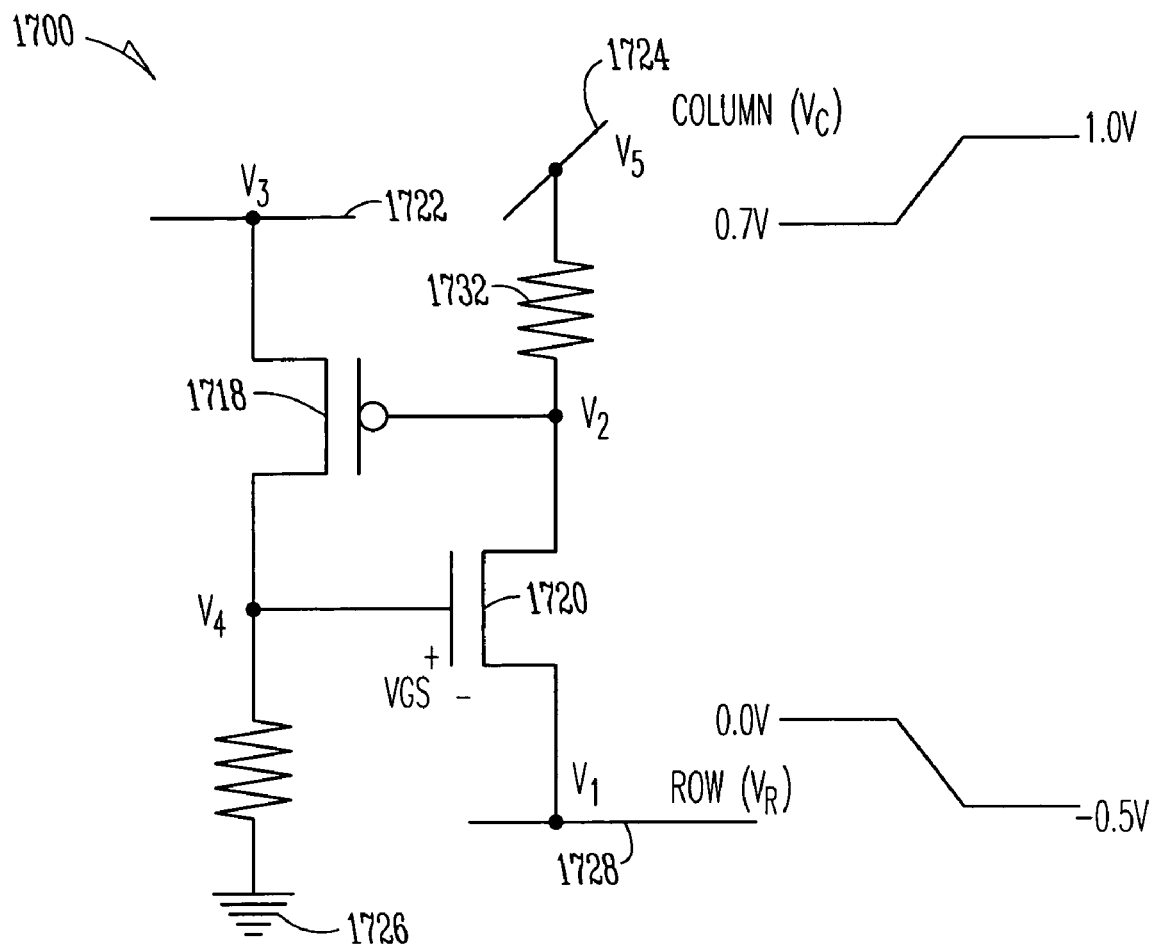
FIGS. 17a and 17b illustrate a technique for overriding a write to another cell in the row, as shown in FIGS. 16a and 16b, to leave a two transistor SRAM cell off or in a logical 0 state, according to the teachings of the present invention.
Figure 17B:
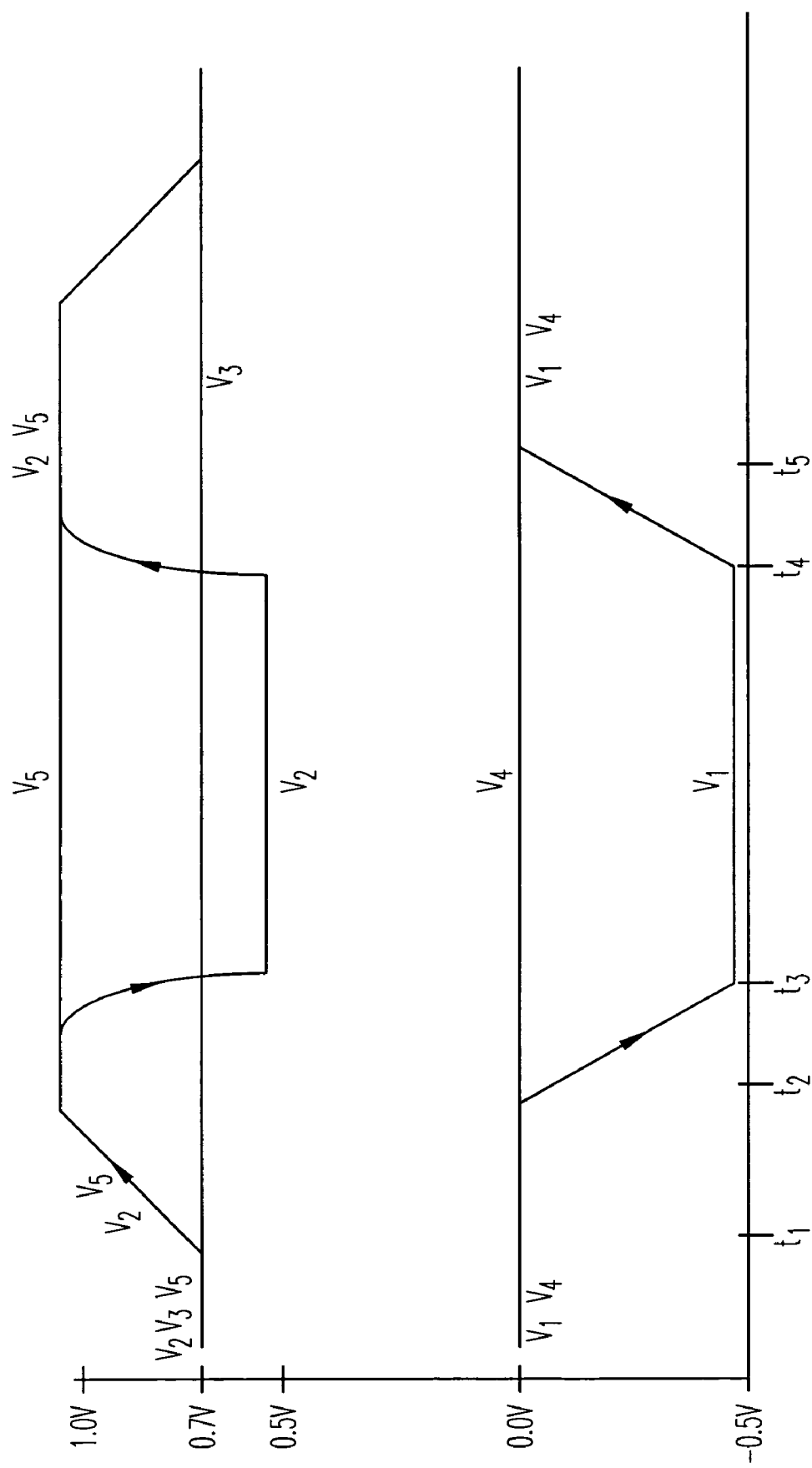

FIGS. 17a and 17b illustrate a technique for overriding a write to another cell in the row while writing a logic 1 to a specific cell such as shown in connection with FIGS. 16a and 16b. The write override technique leaves neighboring two transistor SRAM cells in the same row in an off or zero state when the row potential $V_R$ or $V_1$ is lowered. FIG. 17a illustrates an electrical schematic for the two transistor SRAM cell 1700, and FIG. 17b shows the voltage potentials at the various node voltages $V_1$, $V_2$, $V_3$, $V_4$ and $V_5$ identified in FIG. 17a during an operation for overriding a step down in the potential $V_1$ of a row line 1728 for the purpose of writing to a specific two transistor SRAM cell 1700 in the row. In this example, the potential $V_5$ of the column line 1724 for a neighboring cell, not intended for the write, is raised to a voltage potential at time frame $t_1$ such that, when the potential $V_1$ of the row line 1728 is stepped below the reference ground potential 1726 at time frame $t_2$ and the NMOS transistor 1720 turns on, the node voltage $V_2$ will not drop low enough to turn on the PMOS transistor 1718, i.e. will not provide a gate to source voltage of a magnitude larger than that of the PMOS threshold voltage $V_{TP}$. Since the PMOS transistor 1718 is not actuated, the node voltage $V_4$ remains low, e.g. approximately 0.0V throughout, due to the pull-down load resistor 1726, which is the polysilicon gate of the NMOS transistor 1720 for the merged structure cell embodiment illustrated in FIGS. 10 and 11. Alternatively, the pull down load resistor can be the independent separately fabricated load resistor as exists in the cell structure of FIG. 4. Either way, the node voltage $V_4$ remains low and the PMOS transistor in the cell structure does not conduct. Since the node voltage $V_4$ remains low, the NMOS transistor 1720 will turn off again when the row line 1728 potential $V_R$ is raised again to bring $V_1$ back to approximately 0.0V at time $t_4$. At the same time, node $V_2$ will return to approximately 1.0V because the gate to source voltage of the NMOS transistor 1720 is of a magnitude less than that of the NMOS threshold voltage $V_{TN}$. Thus, at time frame $t_5$ the resulting logic state at node $V_4$ for the SRAM cell 1700, not intended to be written to, will remain in an off state. In other words, cell 1700 retains its logic 0 value at node V4 of approximately 0.0V. The two transistor SRAM cell 1700 remains in an off state. The combination of write technique shown in FIGS. 16a and 16b and the write-override technique shown in FIGS. 17a and 17b provide a system and method for selectively turning on or storing a logical 1 datum for the selected cells along a particular row or word line in a memory device.

Figure 18:
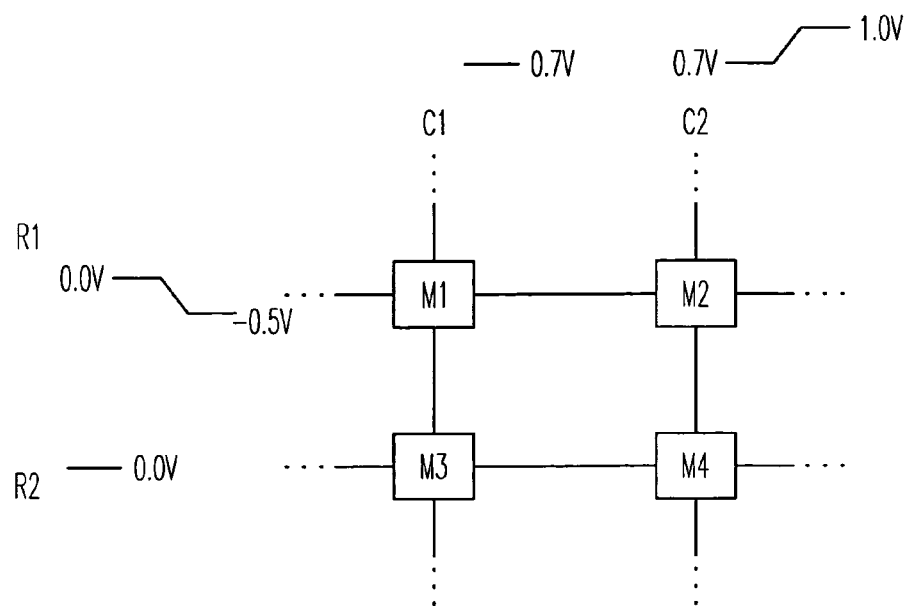
FIG. 18 illustrates a situation used to show that raising the column line potential for the write override technique, shown in FIGS. 17a and 17b, does not adversely affect the stability of other memory cells along the column line.
Figure 19A:
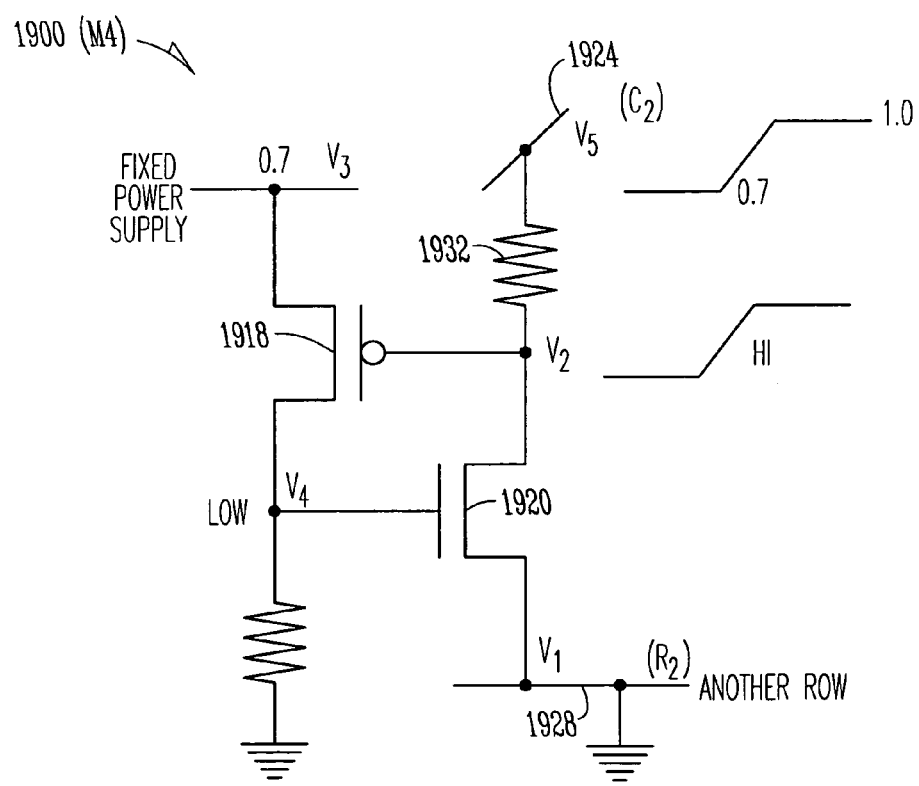
FIG. 19a shows that raising the column line potential while maintaining a constant row voltage will not cause a two transistor SRAM cell to make a transition from off or a logical 0 state to on or a logical 1 state.
Figure 19B:
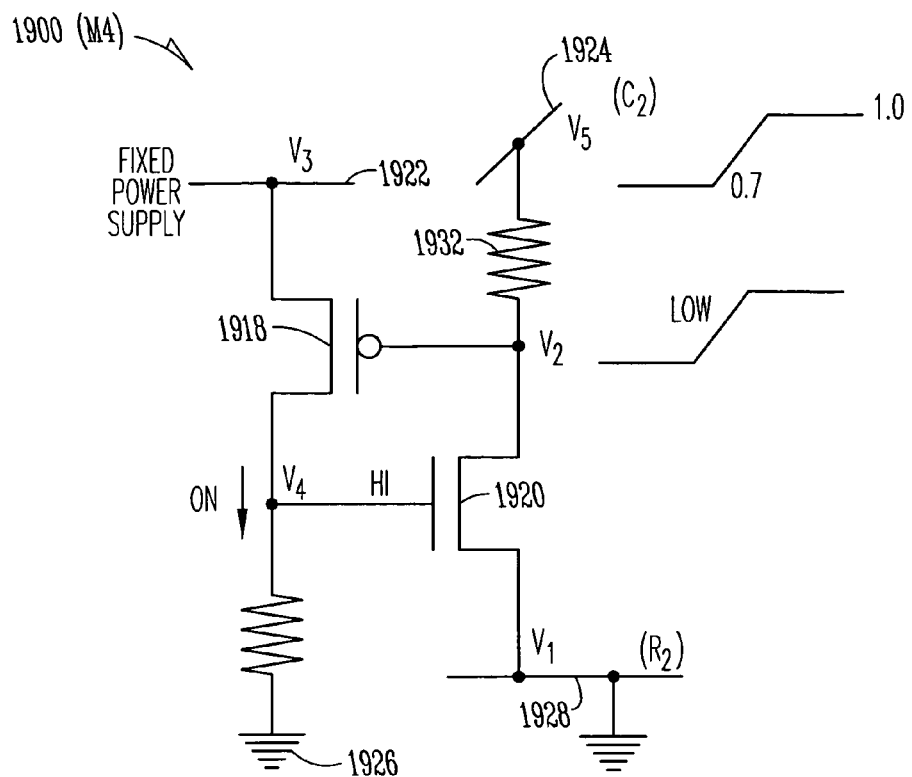
FIG. 19b shows that raising the column line potential while maintaining a constant row voltage will not cause a two transistor SRAM cell to make a transition from on or a logical 1 state to off or a logical 0 state.

FIGS. 18, 19a and 19b illustrate that the adjustment of the column line potential $V_C$, i.e. $V_5$, used in the write-override technique described above with respect to FIGS. 17a and 17b will not disturb the state of cells in other rows or word lines if the potential $V_1$ of the word line remains constant. The situation is illustrated in the partial memory array shown in FIG. 18. Assume that it is intended to write or set memory cell M1 to a logical one state, but to leave memory cell M2 in a logical zero state. Additionally, it is intended to not adversely affect the state of the memory cells M3 and M4 in a neighboring row during the write and write override operations. The potential of row R1 is lowered from 0.0V to −0.5V to write or set the row of memory cells M1 and M2. As provided above, to prevent a write to memory cell M2 which is in the same row as memory cell M1, the column line C2 is raised from about 0.7V to about 1.0V. As is discussed below with respect to FIGS. 18a and 19, the stepped up potential on column C2 does not cause the memory cell M4 to become unstable and switch from an "off" or zero state to an "on" or one state, or switch from an "on" or one state to an "off" or zero state. The result is that only memory cell M1 is written or set to a logical one state.

FIG. 19a illustrates that, if the cell 1900, i.e. the memory cell M4 of FIG. 18, is off and is intended to remain off, raising the column line potential $V_C$, i.e. $V_5$, while maintaining a constant row line potential $V_R$, i.e. $V_1$, will not cause a two transistor SRAM cell 1900 to make a transition from the off or zero state to an on or one state. The NMOS transistor 1920 remains off because the node voltages $V_1$ and $V_4$ have not changed states. The off state of the PMOS transistor 1918 is enforced since stepping the potential $V_5$ of the column line 1924, from 0.7V to 1.0V in the illustrated example, raises the node voltage $V_2$ at the gate of the PMOS transistor 1918 maintaining PMOS transistor 1918 in an "off" state.

FIG. 19b illustrates that, if the cell 1900, i.e. the memory cell M4 of FIG. 18, is "on", i.e. stores a logic 1 value at node $V_4$, and is intended to stay on, raising the column line potential $V_C$, i.e. $V_5$, while maintaining a constant row line potential $V_R$, i.e. $V_1$, will not cause a two transistor SRAM cell 1900 to make a transition from the on or one logic state to the off or zero logic state at node $V_4$. The potential $V_5$ of the column line 1924 increases due to a write-override operation for a SRAM cell in another row. However, the node voltage $V_2$ only increases by a small amount since the resistance of the actuated NMOS transistor 1920 is low in comparison to the value of the load resistor 1932, which is the polysilicon gate of the PMOS transistor 1918 in the merged structure cell embodiment illustrated in FIG. 10. Therefore, the PMOS transistor 1918 will remain on, the node voltage $V_2$ will remain low, and the node voltage $V_4$ will remain high. Thus, it has been shown that the write and write override techniques provided above will not adversely affect the states of memory cells in neighboring rows.

Figure 20:
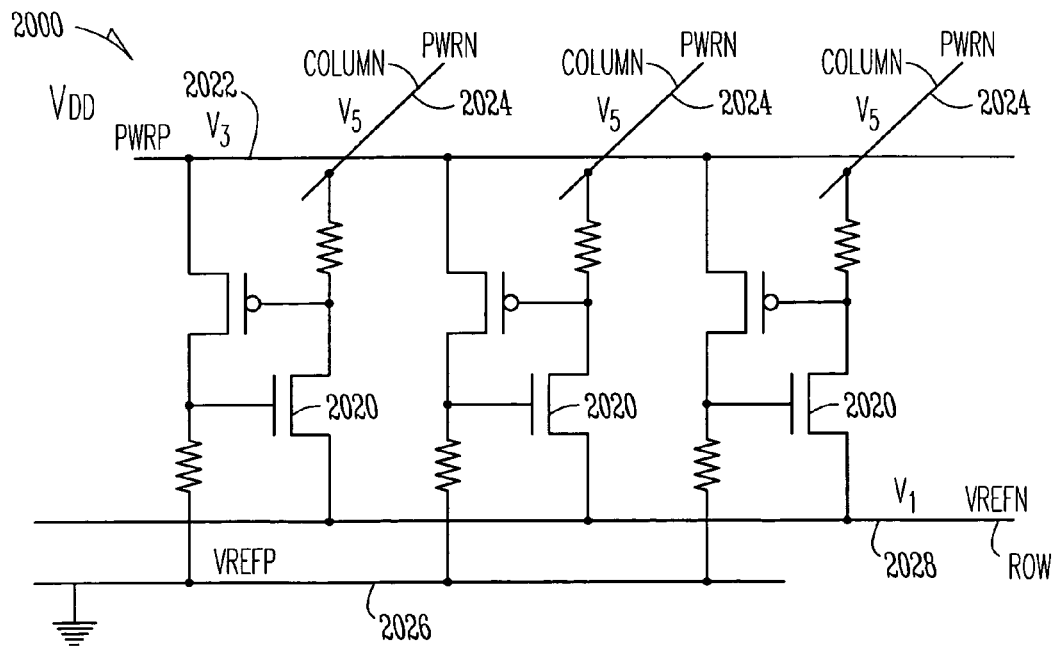
FIG. 20 illustrates a SRAM cell array, incorporating the present invention.

FIG. 20 illustrates a SRAM cell array 2000. The array 2000 includes a plurality of two transistor SRAM cells, with or without a merged structure. The array 2000 also includes a power supply line PWRP 2022 to power the PMOS side of the cell or the PMOS resistive load inverter, and a power supply line PWRN 2024 to power the NMOS side of the cell or the NMOS resistive load inverter. The array 2000 also includes two reference voltage lines VREFP 2026 for the PMOS side of the cell and VREFN 2028 for the NMOS side of the cell. In one embodiment of the cell array 2000, the PWRP line 2022 is a constant voltage supply $V_{DD}$, such as 0.7V for example, and the VREFP line 2026 is a ground reference potential line, such as 0.0V. Additionally, for each cell in the array 2000, the PWRN line 2024 is one of a plurality of column or bit lines, and the VREFN line is one of a plurality of row or word lines 2028. The column lines 2024 and the row or bit lines 2028 have adjustable potentials. In one embodiment of the array 2000, the column lines 2024 have a steady state or normal potential of 0.7V that corresponds to the potential of the PWRP line 2022. The column line 2024 can also be stepped up to a potential of about 1.0V for a write override technique as described above. The row line 2028, in this embodiment, has a steady state or normal potential of about 0.0V that corresponds to the potential of the VREFP line 2026. As explained above, the row line 2028 can be stepped up to a potential of about 0.5V for a reset operation, stepped down to a potential of −0.5V for a write operation, and adjusted to a voltage between 0.0V and about −0.35V for a read operation.

Figure 21:
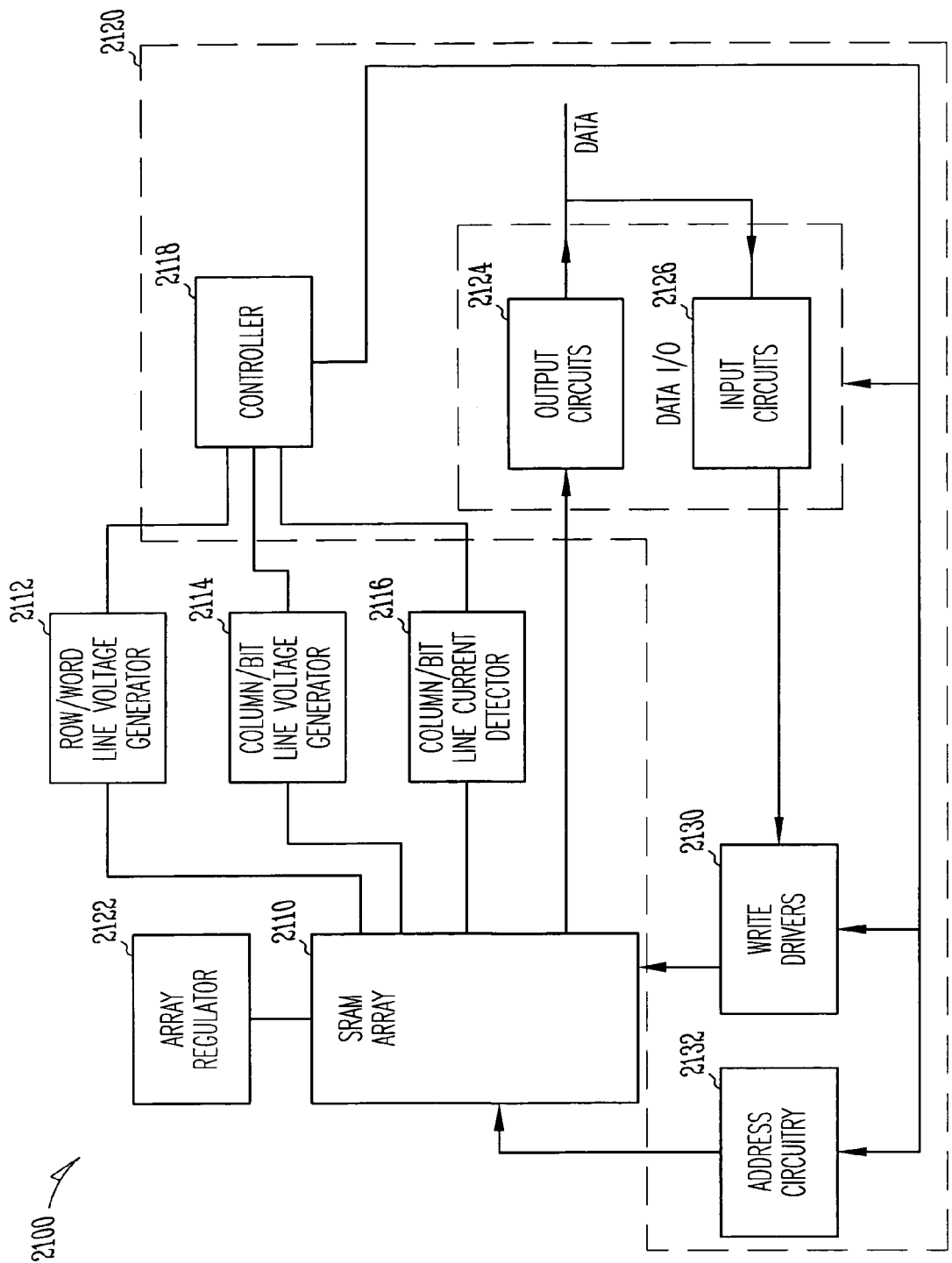
FIG. 21 illustrates a block diagram of a memory device, incorporating the present invention.

FIG. 21 illustrates a block diagram of a memory device. The memory circuit 2100, or memory device, comprises a SRAM array 2110 with two-transistor SRAM cells, with or without merged structures but possessing the unique read and write characteristics, according to the teachings of the present invention. The memory device 2100 also includes a row or word line voltage generator 2112, a column or bit line voltage generator 2114, and a column or bit line current detector 2116. Circuit 2100 further includes a controller 2118 for controlling the voltage generators 2112 and 2114 and the current detector 2116. The controller 2118 of the memory device can be part of several periphery circuits 2120. As one of ordinary skill in the art will understand, these periphery circuits 2120 can further include output circuits 2124, input circuits 2126, write drivers 2130, and address circuitry 2132. A voltage regulator 2122 is coupled to the SRAM array 2110. The array regulator 2122 provides a regulated array supply voltage for the memory device 2100.

Figure 22:
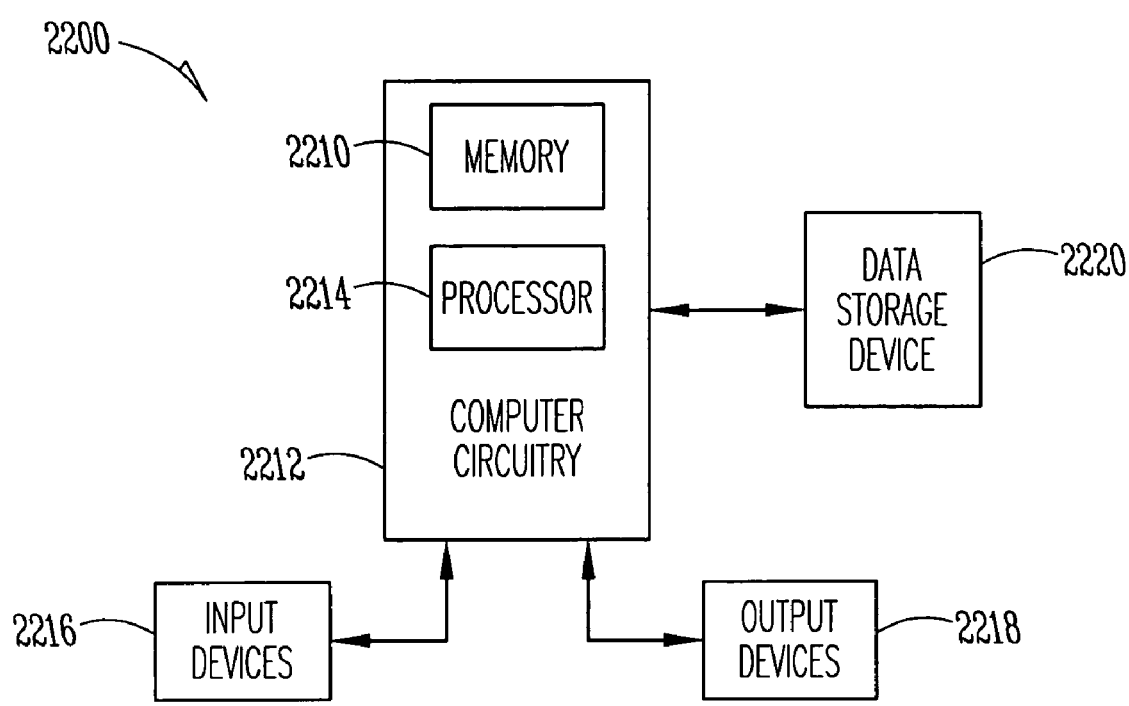
FIG. 22 illustrates a block diagram of an electronic system, incorporating the present invention.

FIG. 22 illustrates a block diagram of an electronic system 2200, such as a computer system, that incorporates the memory device 2210 having a memory array with two-transistor SRAM cells, with or without merged structures but possessing the unique read and write characteristics, according to the teachings of the present invention. The system 2200 includes computer circuitry 2212 for performing computer functions, such as executing software to perform desired calculations and tasks. The computer circuitry 2212 includes a processor 2214 and the memory circuit 2210, which is coupled to the processor. One or more input devices 2216, such as a keyboard or a mouse, are coupled to the computer circuitry 2212 and allow data to be input into the system 2200. One or more output devices 2218 are coupled to the computer circuitry 2212 to provide output information generated by the computer circuitry 2212. Examples of output devices 2218 include a printer and a video display unit. One or more data storage devices 2220 are coupled to the computer circuitry to store data on or retrieve data from external storage media. Examples of the storage devices and the corresponding storage media include drives that accept hard and floppy disks, tape cassettes, and compact disk read-only memories (CD ROMS).

The figures presented and described in detail above are similarly useful in describing the method aspects of the present subject matter. The methods described below are nonexclusive as other methods may be understood from the specification and the figures described above.

FIG. 23 provides a table that illustrates a method of operating a memory array, particularly the Reset, Write, Write Override, and Read operations. Each operation is listed in the first column of the table, and a corresponding condition for each operation is listed in the second column of the table. An example of each operation is illustrated in the third column using the column line voltage $V_C$ and the row line voltage $V_R$. As described above, $V_C$ and $V_R$ are adjustable and provide a potential across one of the resistive load inverters within the memory cell. For the purpose of the discussion below and to correspond to the illustrations previously discussed above, it is assumed that $V_C$ and $V_R$ provide an adjustable potential across the NMOS resistive load inverter while constant potential lines are applied across the PMOS resistive load inverter. It is further assumed that $V_C$ has a potential that is more positive than $V_R$. Based upon the teachings of the present invention, one of ordinary skill in the art would understand how to apply the adjustable potentials $V_C$ and $V_R$ across the PMOS resistive load inverter and the constant potential lines across the NMOS resistive load inverter; and further would understand that other polarities of $V_C$ and $V_R$ and other adjustments in the potentials $V_C$ and $V_R$ are capable of achieving the desired result.

Referring to the third column entitled EXAMPLE, examples of the potentials $V_C$ and $V_R$ are shown for each operation. The difference between the column and row potentials $V_C$ and $V_R$ is represented as $V_{DIFF}$, which is the potential applied across the resistive load inverter. If either of the potentials $V_C$ or $V_R$ is adjusted, the adjusted potential is represented as $\Delta V_1$. If both of the potentials $V_C$ and $V_R$ are adjusted, one is represented as $\Delta V_1$ and the other as $\Delta V_2$. Although $\Delta V_1$ is shown as the adjustment to the potential $V_R$ and $\Delta V_2$ is shown as the adjustment to the potential $V_C$, it is not intended to be so limited. The condition column represents each operation as a formula with respect to $V_{DIFF}$, $\Delta V_1$, $\Delta V_2$, and the threshold voltage $V_T$ of the transistor in a resistive load inverter.

One aspect provides a method of reading a memory cell. According to this method, a potential difference ($V_{DIFF}$) is applied to a selected memory cell by providing a column potential ($V_C$) on a column line and a row potential ($V_R$) on a row line. $V_C$ and $V_R$ is applied across a resistive load inverter in the selected memory cell. $V_{DIFF}$ is increased by an increment less than a transistor threshold voltage ($V_T$); i.e. $V_{DIFF}-\Delta V_1$, wherein $\Delta V_1 > V_T$. It is then determined whether the increased $V_{DIFF}$ results in a current flow on the column line for the selected memory cell. In one embodiment of the present invention, $V_C$ and $V_R$ are applied across an NMOS resistive load inverter. A constant $V_C$ is maintained and $V_R$ is decreased by an increment less than an NMOS transistor threshold voltage ($V_{TN}$). More current will flow in the corresponding column line through the actuated NMOS transistor if the cell is already on or at a logic 1 state. If the cell is off, unactuated or at a logic 0 state, the stepped down $V_R$ is not low enough to turn the NMOS transistor on.

Another aspect provides a method of writing a memory cell. According to this method, $V_{DIFF}$ is applied to a selected memory cell by providing $V_C$ on a column line and $V_R$ on a row line. $V_{DIFF}$ is increased by an increment more than $V_T$ to set the selected memory cell to a one state, i.e. $V_{DIFF}+\Delta V_1$, wherein $\Delta V_1 > V_T$. $V_C$ and $V_R$ are applied across a resistive load inverter in the selected memory cell, and in one embodiment of the present invention, are applied across an NMOS resistive load inverter. A constant $V_C$ is maintained, and $V_R$ is decreased by an increment more than an NMOS transistor threshold voltage ($V_{TN}$).

A write override operation prevents the lowered $V_R$ from causing an unintended write on another memory cell in the row. According to a write override operation, $V_{DIFF}$, which has previously been increased by an increment more than $V_T$ due to a write operation, is further increased by a second increment; i.e. $V_{DIFF}+\Delta V_1+\Delta V_2$, wherein $\Delta V_1 > V_T$ and $\Delta V_2$ provides a sufficient amount of "extra voltage headroom" for the resistive load inverter to prevent the cell from being set or written.

The selected memory cell is reset to a zero state by decreasing $V_{DIFF}$ by an increment more than $V_{TN}$. In one embodiment, a row of memory cells is reset by raising $V_R$ by an increment more than $V_{TN}$. Lowering $V_R$ turns on the NMOS transistor, which in turn, turns on the PMOS transistor. The transistors remain on after the $V_R$ returns to its original value.

Another aspect provides a method of operating a memory array. According to this method, $V_{DIFF}$ is applied to each of a plurality of memory cells by providing $V_C$ on a column line and $V_R$ on a row line. A first selected memory cell is reset to a zero state by decreasing $V_{DIFF}$ by an increment more than $V_T$. A second selected memory cell is written to a one state by increasing $V_{DIFF}$ by an increment more than $V_T$. A third selected memory cell is read by increasing $V_{DIFF}$ by an increment less than $V_T$, and determining whether the increased $V_{DIFF}$ results in a current flow on the column line for the selected memory cell. The first, second and third selected memory cells may consist of the same cell or different cells within the memory array. In the embodiment illustrated in the figures, a cell is written to by lowering $V_R$. The column line is raised for those cells in the row which are not to be written into a one state. Although the NMOS transistor will temporarily turn on when $V_R$ is lowered, this adjustment of this $V_C$ is sufficient to prevent the PMOS transistor from turning on.

One aspect provides a method of forming a memory cell. A PMOS transistor is formed with a gate, and an NMOS transistor is formed with a gate. In one embodiment, the gates are formed with a lightly doped polysilicon material. The PMOS transistor gate is coupled in series with the NMOS transistor, and the NMOS transistor gate is coupled in series with the PMOS transistor. In one embodiment, the PMOS transistor and the NMOS transistor gate are coupled between a PWRP power supply and a first reference line, and the NMOS transistor and the PMOS transistor gate are coupled between a PWRN power supply and a second reference line. In one embodiment, the PWRP power supply and the first reference line have constant potentials, and the PWRN power supply and the second reference line have adjustable potentials.

Another aspect provides a method of forming a memory system. A plurality of memory cells is formed, each being formed as described above. A sense amplifier is formed with a predicted output circuit that anticipates the bistable circuit will be in a state in which the transistors are off.

Another aspect provides a method of forming a SRAM circuit. A memory array, a controller, a row line voltage generator, a column line voltage generator, and a column line current detector are provided. The controller is coupled to the row line voltage generator, the column line voltage generator, and the column line current detector. The row line voltage generator is coupled to row lines within the memory array such that the controller is able to vary a potential on a selected row line. The column line voltage generator is coupled to column lines within the memory array such that the controller is able to vary a potential on one or more selected column lines. The column line current detector is coupled to the column lines within the memory array such that the controller is able to determine current flow on a selected current line. The memory array includes a plurality of memory cells, which are formed as described above.

CONCLUSION

The present subject matter provides a merged structure SRAM cell and also provides read and write techniques for a two transistor SRAM cell that allow for high density SRAM cell designs while avoiding excessive power dissipation. The merged structure SRAM cell includes a cross-coupled PMOS transistor and NMOS transistor. The polysilicon gate of the PMOS transistor is coupled between a drain/source region of the NMOS transistor and a power supply PWRN and functions as a load resistor for the NMOS transistor. The polysilicon gate of the NMOS transistor is coupled between the drain/source region of the PMOS transistor and a reference ground potential and functions as a load resistor for the PMOS transistor. The read and write techniques for a two transistor SRAM cell eliminate the need for conventional access transistors. Read and write operations are performed by adjusting row and column potentials. One embodiment includes an output memory sense scheme that compensates for a slower response caused by a state transition that requires current to flow through the load resistors rather than through the cross coupled PMOS transistor and NMOS transistor. Thus, the present invention provides a SRAM cell design that reduces the silicon area consumed by the cells, increases their operating speed, and reduces power dissipation.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. It is to be understood that the above description is intended to be illustrative, and not restrictive. Combinations of the above embodiments, and other embodiments will be apparent to those of skill in the art upon reviewing the above description. The scope of the invention includes any other applications in which the above structures and fabrication methods are used. The scope of the invention should be determined with reference to the appended claims, along with the full scope of equivalents to which such claims are entitled.

What is claimed is:

1. An apparatus, comprising:
   means for applying a potential difference ($V_{DIFF}$) to a selected memory cell that includes a transistor, including means for providing a column potential ($V_C$) on a column line and a row potential ($V_R$) on a row line;
   means for increasing $V_{DIFF}$ by an increment less than a transistor threshold voltage ($V_T$) for the transistor of the memory cell; and
   means for determining whether the increased $V_{DIFF}$ results in a current flow on the column line for the selected memory cell.

2. The apparatus of claim 1, wherein the means for applying a potential difference ($V_{DIFF}$) to a selected memory cell includes means for applying $V_C$ and $V_R$ across a resistive load inverter in the selected memory cell.

3. The apparatus of claim 2, wherein:
   the means for applying $V_C$ and $V_R$ across a resistive load inverter includes means for applying $V_C$ and $V_R$ across an NMOS resistive load inverter; and
   the means for increasing $V_{DIFF}$ by an increment less than $V_T$ includes means for maintaining a constant $V_C$ and means for decreasing $V_R$ by an increment less than an NMOS transistor threshold voltage ($V_{TN}$).

4. The apparatus of claim 1, wherein the means for increasing $V_{DIFF}$ by an increment less than $V_T$ includes means for decreasing $V_R$ by an increment less than $V_T$.

5. An apparatus, comprising:
   means for applying a potential difference ($V_{DIFF}$) to a selected memory cell that includes a transistor, including means for providing a column potential ($V_C$) on a column line and a row potential ($V_R$) on a row line, wherein the means for applying $V_{DIFF}$ to a selected memory cell includes means for applying $V_C$ and $V_R$ across a resistive load inverter in the selected memory cell; and
   means for increasing $V_{DIFF}$ by an increment more than a transistor threshold voltage ($V_T$) for the transistor of the memory cell to set the selected memory cell to a one state.

6. The apparatus of claim 5 wherein:
   the means for applying $V_C$ and $V_R$ across a resistive load inverter includes means for applying $V_C$ and $V_R$ across an NMOS resistive load inverter; and
   the means for increasing $V_{DIFF}$ by an increment more than $V_T$ includes means for maintaining a constant $V_C$ and means for decreasing $V_R$ by an increment more than an NMOS transistor threshold voltage ($V_{TN}$).

7. The apparatus of claim 5, wherein the means for increasing $V_{DIFF}$ by an increment more than $V_T$ includes means for decreasing $V_R$ by an increment more than $V_T$.

8. The apparatus of claim 5, further comprising means for decreasing $V_{DIFF}$ by an increment more than $V_T$ to reset the selected memory cell to a zero state.

9. The apparatus of claim 8, wherein the means for decreasing $V_{DIFF}$ by an increment more than $V_T$ to reset the selected memory cell includes means for increasing $V_R$ by an increment more than $V_T$.

10. An apparatus comprising:
    means for applying a potential difference ($V_{DIFF}$) to each of a plurality of memory cells by providing a column potential ($V_C$) on a column line and a row potential ($V_R$) on a row line;
    means for resetting a first selected memory cell to a zero state by decreasing $V_{DIFF}$ by an increment more than a transistor threshold voltage ($V_T$) to reset the selected memory cell to a zero state;
    means for writing a second selected memory cell to a one state by increasing $V_{DIFF}$ by an increment more than $V_T$ to set the selected memory cell to the one state; and
    means for reading a third selected memory cell including:
       means for increasing $V_{DIFF}$ by an increment less than $V_T$; and
       means for determining whether the increased $V_{DIFF}$ results in a current flow on the column line for the selected memory cell.

11. The apparatus of claim 10, wherein the means for applying a potential difference ($V_{DIFF}$) in each of a plurality of memory cells includes a means for applying $V_C$ and $V_R$ across a resistive load inverter in each of the plurality of memory cells.

12. The apparatus of claim 11, wherein:
    the means for applying $V_C$ and $V_R$ across a resistive load inverter includes means for applying $V_C$ and $V_R$ across an NMOS resistive load inverter; and
    the means for writing a second selected memory cell by increasing $V_{DIFF}$ by an increment more than $V_T$ includes means for maintaining a constant $V_C$ and means for decreasing $V_R$ by an increment more than an NMOS transistor threshold voltage ($V_{TN}$).

13. The apparatus of claim 10, wherein the means for writing a second selected memory cell includes means for decreasing $V_R$ by an increment more than a $V_T$.

14. The apparatus of claim 10, wherein the means for resetting a first selected memory cell includes means for resetting a row of cells, including means for adjusting $V_R$ by an increment larger than $V_T$.

15. The apparatus of claim 10, wherein the means for writing a second selected memory cell includes:
 means for adjusting $V_R$ for a write operation by an increment greater than a transistor threshold voltage to turn a first transistor on for cells within a selected row; and
 means for adjusting a second column potential $V_C$ on a second column line by an amount to prevent a second transistor in the selected row from turning on in response to adjusting the row potential for the write operation.

16. The apparatus of claim 10, wherein the means for reading a third selected memory cell includes:
 means for decreasing $V_R$ by an increment less than a transistor threshold voltage increment; and
 means for determining if the decreased $V_R$ results in a current flow on a corresponding column line for the memory cell.

17. An apparatus, comprising:
 means for reading a selected memory cell, including:
  means for applying a first potential difference ($V_{DIFF}$) to the selected memory cell, including means for providing a column potential ($V_C$) on a column line and a row potential ($V_R$) on a row line;
  means for increasing $V_{DIFF}$ by an increment less than a transistor threshold voltage ($V_T$); and
  means for determining whether the increased $V_{DIFF}$ results in a current flow on the column line for the selected memory cell; and
 means for writing the selected memory cell, including:
  means for applying a second potential difference ($V_{DIFF}$) to the selected memory cell, including means for providing a column potential ($V_C$) on a column line and a row potential ($V_R$) on a row line; and
  means for increasing $V_{DIFF}$ by an increment more than $V_T$ to set the selected memory cell to a one state.

18. The apparatus of claim 17, wherein the means for applying the first potential difference ($V_{DIFF}$) to a selected memory cell includes means for applying $V_C$ and $V_R$ across a resistive load inverter in the selected memory cell.

19. The apparatus of claim 17, wherein the means for increasing $V_{DIFF}$ by an increment less than $V_T$ includes means for decreasing $V_R$ by an increment less than $V_T$.

20. The apparatus of claim 17, wherein the means for applying the second potential difference ($V_{DIFF}$) to a selected memory cell includes means for applying $V_C$ and $V_R$ across a resistive load inverter in the selected memory cell.

21. The apparatus of claim 17, wherein the means for increasing $V_{DIFF}$ by an increment more than $V_T$ includes means for decreasing $V_R$ by an increment more than $V_T$.

22. The apparatus of claim 17, further comprising means for decreasing $V_{DIFF}$ by an increment more than $V_T$ to reset the selected memory cell to a zero state.

* * * * *

UNITED STATES PATENT AND TRADEMARK OFFICE
CERTIFICATE OF CORRECTION

PATENT NO. : 7,233,531 B2 Page 1 of 1
APPLICATION NO. : 11/282273
DATED : June 19, 2007
INVENTOR(S) : Forbes It is certified that error appears in the above-identified patent and that said Letters Patent is hereby corrected as shown below:

On the face page, in field (73), in "Assignee", in column 1, line 1, delete "Micro" and insert -- Micron --, therefor.

In column 1, line 61, delete "LM4TCMOS" and insert -- LL4TCMOS --, therefor.

In column 6, line 3, delete "$V_{ss}$" and insert -- $V_{SS}$ --, therefor.

In column 22, line 17, in Claim 6, after "claim 5" insert -- , --.

In column 23, line 3, in Claim 13, after "than" delete "a".

Signed and Sealed this

Seventh Day of August, 2007

JON W. DUDAS
*Director of the United States Patent and Trademark Office*